US011694997B2

(12) United States Patent
Chen et al.

(10) Patent No.: US 11,694,997 B2
(45) Date of Patent: Jul. 4, 2023

(54) BACKSIDE CONTACT FOR THERMAL DISPLACEMENT IN A MULTI-WAFER STACKED INTEGRATED CIRCUIT

(71) Applicant: Taiwan Semiconductor Manufacturing Company, Ltd., Hsin-Chu (TW)

(72) Inventors: Ping-Tzu Chen, Tainan (TW); Hsing-Chih Lin, Tainan (TW); Min-Feng Kao, Chiayi (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 17/539,258

(22) Filed: Dec. 1, 2021

(65) Prior Publication Data

US 2022/0093571 A1  Mar. 24, 2022

Related U.S. Application Data

(62) Division of application No. 16/568,623, filed on Sep. 12, 2019, now Pat. No. 11,195,818.

(51) Int. Cl.
*H01L 25/065* (2023.01)
*H01L 23/367* (2006.01)
(Continued)

(52) U.S. Cl.
CPC .... *H01L 25/0657* (2013.01); *H01L 21/76831* (2013.01); *H01L 21/76843* (2013.01);
(Continued)

(58) Field of Classification Search
CPC ........ H01L 2225/06503–06596; H01L 25/117; H01L 25/074; H01L 25/0657; H01L 25/043
See application file for complete search history.

(56) References Cited

U.S. PATENT DOCUMENTS 8,674,470 B1   3/2014  Or-Bach et al.
9,640,531 B1   5/2017  Or-Bach et al.
(Continued)

FOREIGN PATENT DOCUMENTS

CN   111785646 A  * 10/2020  ............. H01L 21/50

OTHER PUBLICATIONS

R. L. de Orio. "Electromigration Modeling and Simulation—1.1 Dual-Damascene Fabrication Process." The date of publication is unknown. Retrieved online on Jul. 30, 2019 from www.iue.tuwien.ac.at/phd/orio/node10.html.
(Continued)

*Primary Examiner* — Jarrett J Stark
(74) *Attorney, Agent, or Firm* — Eschweiler & Potashnik, LLC

(57) ABSTRACT

In some embodiments, the present disclosure relates to method of forming an integrated circuit, including forming a semiconductor device on a frontside of a semiconductor substrate; depositing a dielectric layer over a backside of the semiconductor substrate; patterning the dielectric layer to form a first opening in the dielectric layer so that the first opening exposes a surface of the backside of the semiconductor substrate; depositing a glue layer having a first thickness over the first opening; filling the first opening with a first material to form a backside contact that is separated from the semiconductor substrate by the glue layer; and depositing more dielectric layers, bonding contacts, and bonding wire layers over the dielectric layer to form a second bonding structure on the backside of the semiconductor substrate, so that the backside contact is coupled to the bonding contacts and the bonding wire layers.

20 Claims, 15 Drawing Sheets

(51) Int. Cl.
| | |
|---|---|
| *H01L 23/48* | (2006.01) |
| *H01L 27/088* | (2006.01) |
| *H01L 21/768* | (2006.01) |
| *H01L 23/00* | (2006.01) |
| *H01L 23/522* | (2006.01) |
| *H01L 23/528* | (2006.01) |
| *H01L 23/532* | (2006.01) |

(52) U.S. Cl.
CPC .. *H01L 21/76877* (2013.01); *H01L 21/76898* (2013.01); *H01L 23/367* (2013.01); *H01L 23/481* (2013.01); *H01L 23/5226* (2013.01); *H01L 23/5283* (2013.01); *H01L 23/53228* (2013.01); *H01L 23/53257* (2013.01); *H01L 24/03* (2013.01); *H01L 24/05* (2013.01); *H01L 24/08* (2013.01); *H01L 27/088* (2013.01); *H01L 24/89* (2013.01); *H01L 2224/0557* (2013.01); *H01L 2224/08147* (2013.01); *H01L 2224/80895* (2013.01); *H01L 2224/80896* (2013.01); *H01L 2225/06541* (2013.01); *H01L 2225/06565* (2013.01); *H01L 2225/06589* (2013.01)

(56) References Cited

U.S. PATENT DOCUMENTS

| | | | |
|---|---|---|---|
| 10,049,915 | B2 | 8/2018 | Fong et al. |
| 10,510,684 | B2 | 12/2019 | Wu et al. |
| 10,573,627 | B2 | 2/2020 | Fong et al. |
| 10,643,927 | B1 | 5/2020 | Shank et al. |
| 2008/0277778 | A1* | 11/2008 | Furman ............... H01L 21/2007 257/713 |
| 2011/0049717 | A1 | 3/2011 | West |
| 2011/0084365 | A1* | 4/2011 | Law ................... H01L 25/0657 257/784 |
| 2011/0248403 | A1* | 10/2011 | Chandrasekaran ..... H01L 24/94 257/E21.705 |
| 2012/0056314 | A1 | 3/2012 | Pagaila et al. |
| 2012/0199984 | A1* | 8/2012 | Fujita ................. H01L 21/6835 438/700 |
| 2013/0062736 | A1 | 3/2013 | Brighton et al. |
| 2013/0113103 | A1 | 5/2013 | West et al. |
| 2014/0124900 | A1 | 5/2014 | West et al. |
| 2014/0131841 | A1 | 5/2014 | Tseng et al. |
| 2014/0239457 | A1 | 8/2014 | Daubenspeck et al. |
| 2015/0021773 | A1 | 1/2015 | Lee |
| 2015/0235949 | A1 | 8/2015 | Yu et al. |
| 2015/0311142 | A1 | 10/2015 | Sekar et al. |
| 2016/0035722 | A1 | 2/2016 | Or-Bach et al. |
| 2016/0049371 | A1 | 2/2016 | Lee et al. |
| 2016/0093591 | A1 | 3/2016 | Lan et al. |
| 2016/0379936 | A1 | 12/2016 | Spitzlsperger et al. |
| 2017/0148674 | A1 | 5/2017 | Lu et al. |
| 2018/0025970 | A1 | 1/2018 | Kao et al. |
| 2019/0067228 | A1 | 2/2019 | Son et al. |
| 2020/0058617 | A1 | 2/2020 | Wu et al. |
| 2020/0176420 | A1* | 6/2020 | Or-Bach ................ H01L 23/46 |
| 2020/0328186 | A1 | 10/2020 | Liu |
| 2020/0381362 | A1 | 12/2020 | Tseng et al. |

OTHER PUBLICATIONS

Wikipedia.org. "Copper Interconnects." Published on Jun. 25, 2019.
Wikipedia.org "Diffusion Barrier." Published on Jan. 11, 2019.
Wikipedia.org "Three-Dimensional Integrated Circuit." Published on Jul. 25, 2019.
Non-Final Office Action dated Feb. 10, 2021 for U.S. Appl. No. 16/568,623.
Final Office Action dated Apr. 19, 2021 for U.S. Appl. No. 16/568,623.
Notice of Allowance dated Aug. 4, 2021 for U.S. Appl. No. 16/568,623.

* cited by examiner

BACKSIDE CONTACT FOR THERMAL DISPLACEMENT IN A MULTI-WAFER STACKED INTEGRATED CIRCUIT

REFERENCE TO RELATED APPLICATION

This application is a Divisional of U.S. application Ser. No. 16/568,623, filed on Sep. 12, 2019, the contents of which are hereby incorporated by reference in their entirety.

BACKGROUND

The semiconductor industry continues to improve the integration density of various electronic components (e.g., transistors, diodes, resistors, capacitors, etc.) by, for example, reducing minimum feature sizes, which allows more components to be integrated into a given area. Smaller package structures, that utilize less area or smaller heights, are developed to package the semiconductor devices. For example, to further increase circuit density per area, three-dimensional (3D) integrated circuits (ICs) have been investigated.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
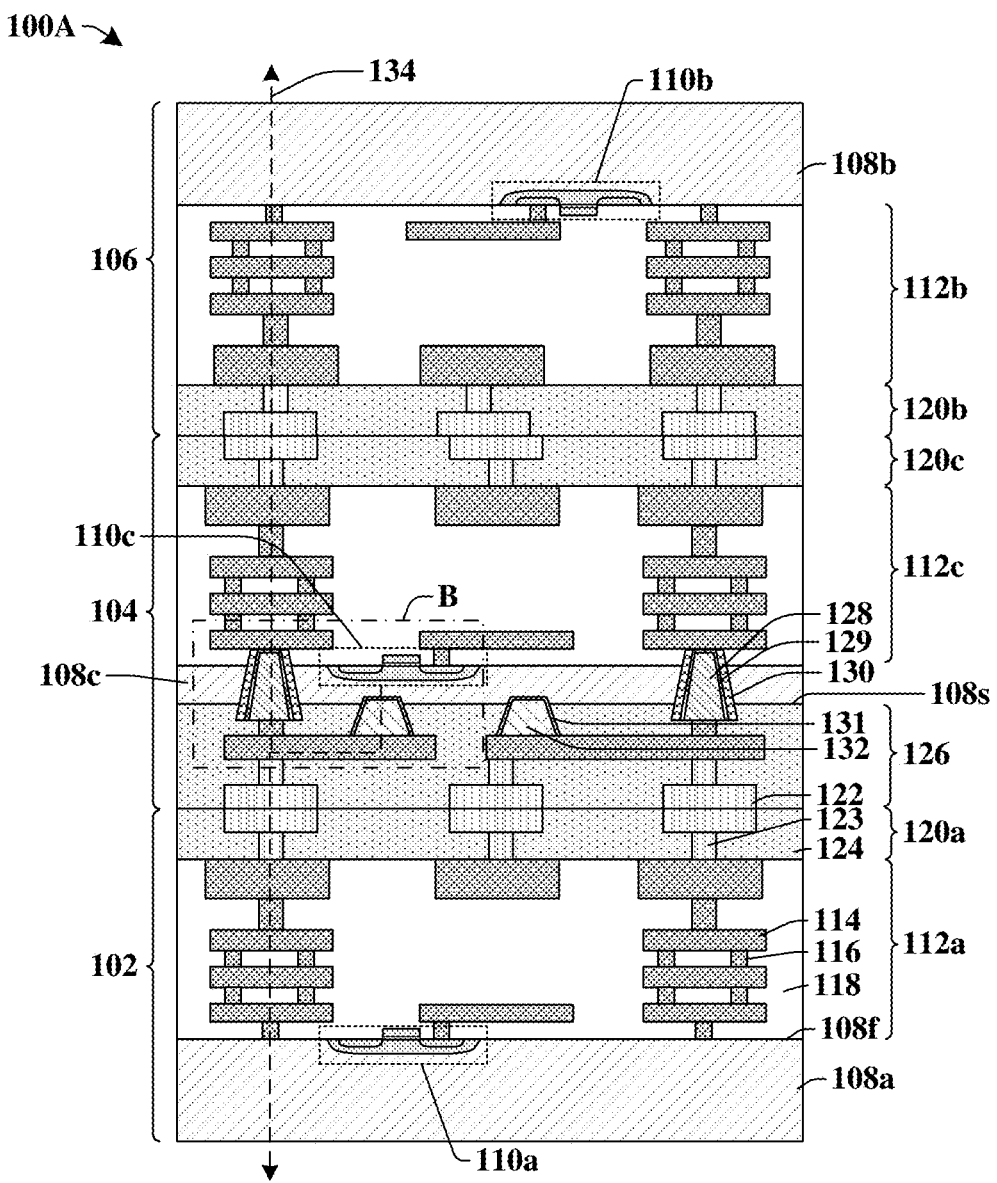
FIGS. 1A, 1B, and 1C illustrate cross-sectional views of some embodiments of a three-dimensional (3D) integrated circuit (IC) stack comprising a backside contact in a third IC die of the 3D IC stack.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A three-dimensional (3D) integrated circuit (IC) may include a third IC die vertically stacked between a first IC die and a second IC die. The first, second, and third IC dies may each comprise a semiconductor substrate, a semiconductor device integrated on the semiconductor substrate, and an interconnect structure comprising alternating stacks of wiring layers and vias embedded in a dielectric structure. The third IC die may be bonded to the first IC die and the second IC die through bonding structures. The bonding structures may comprise bonding wire layers and bonding contacts embedded within bonding dielectric layers. Further, the third IC die may comprise a through substrate via (TSV) that electrically couples the first, second, and third IC dies. The TSV may have sidewall liners to electrically insulate the TSV from the semiconductor device of the third IC die. The sidewall liners often comprise a dielectric material, such as an oxide (e.g., silicon dioxide) or a nitride (e.g., silicon nitride).

Thus, the semiconductor substrate of the third IC die may be surrounded by and in direct contact with dielectric materials that are electrical insulators. The semiconductor device of the third IC die may generate heat during operation in the semiconductor substrate, which may damage the semiconductor device because of inefficient heat dissipation by surrounding dielectric materials in the third IC die. Further, if a 3D IC comprises more than three IC dies with similar or same designs (e.g., size/position of semiconductor device, interconnect structure, etc.), heat build-up in the semiconductor substrates of the IC dies between the first and second IC dies may be even greater and thus, more damaging than heat build-up a 3D IC having one IC die between first and second IC dies.

Various embodiments of the present disclosure present a 3D IC comprising a third IC die vertically stacked between first and second IC dies. The third IC die comprises a semiconductor device integrated on a frontside of a third semiconductor substrate. The third IC die may further comprise a backside contact on a backside of a third semiconductor substrate, but also spaced from an active area of the semiconductor device to avoid electrical interference. The backside contact comprises a material with a high thermal conductivity that is coupled to bonding wires and interconnect wires in the 3D IC. A glue layer may separate the backside contact from direct contact with the third semiconductor substrate. The glue layer is thinner than the sidewall liners of the TSV. Thus, during operation of the semiconductor device in the third semiconductor substrate, generated heat may dissipate more quickly through the backside contact than the TSV, travel through interconnect wires, and exit through semiconductor substrates of the first and/or second IC dies, thereby preventing heat build-up and eventual performance degradation of the 3D IC.

FIG. 1A illustrates a cross-sectional view 100A of some embodiments of a three-dimensional (3D) integrated circuit (IC) stack comprising a backside contact.

The 3D IC stack of the cross-sectional view 100A includes a first IC die 102, a third IC die 104 arranged over and bonded to the first IC die 102, and a second IC die 106 arranged over and bonded to the third IC die 104. Each of the first, third, and second IC dies 102, 104, 106 comprise a semiconductor substrate, a semiconductor device (e.g., transistor, capacitor, diode, etc.) on a frontside of the semiconductor substrate, an interconnect structure arranged over the frontside of the semiconductor substrate and the semiconductor device, and a bonding structure arranged over the interconnect structure and the frontside of the semiconductor substrate. For example, the first IC die 102 comprises a first substrate 108a, a first semiconductor device 110a, a first interconnect structure 112a, and a first bonding structure 120a; the second IC die 106 comprises a second substrate 108b, a second semiconductor device 110b, a second interconnect structure 112b, and a second bonding structure 120b; and the third IC die 104 comprises a third substrate 108c, a third semiconductor device 110c, a third interconnect structure 112c, and a third bonding structure 120c. Each of the interconnect structures (e.g., 112a, 112b, 112c) may comprise a network of interconnect wires 114 and interconnect vias 116 surrounded by an interconnect dielectric structure 118. The network of interconnect wires 114 and interconnect vias 116 of the first interconnect structure 112a, the second interconnect structure 112b, and the third interconnect structure 112c are electrically coupled to the first semiconductor device 110a, the second semiconductor device 110b, and the third semiconductor device 110c, respectively. In some embodiments, each of the first, second, and third bonding structures 120a, 120b, 120c may comprise bonding vias 123 and bonding wire layers 122 embedded within a bonding dielectric structure 124. In some embodiments, the bonding structures (e.g., 120a, 120b, 120c) may be, for example, hybrid bond (HB) structures. In some embodiments, the second bonding structure 120b is bonded to the third bonding structure 120c, and the first bonding structure 120a is bonded to an additional bonding structure 126 of the third IC die 104.

In embodiments, the additional bonding structure 126 of the third IC die 104 may also be a (HB) structure, for example. In some embodiments, the additional bonding structure 126 may comprise bonding vias 123, bonding wire layers 122, interconnect vias 116, and/or interconnect wires 114 embedded within the bonding dielectric structure 124. The additional bonding structure 126 is disposed on a backside 108s of a third substrate 108c of the third IC die 104. A through substrate via (TSV) 128 may extend from the backside 108s to the frontside 108f of the third substrate 108c. The TSV 128 may be electrically coupled to the third interconnect structure 112c and to conductive components (e.g., interconnect wires 114, interconnect vias 116, bonding wire layers 122, bonding vias 123) of the additional bonding structure 126. Thus, the TSV 128 may comprise a first material that is electrically conductive, and thus, may electrically connect the vertically stacked first, third, and second IC dies 102, 104, 106. In some embodiments, the TSV 128 comprises a TSV lining 130 that surrounds sidewalls of the TSV 128. In some embodiments, the TSV lining 130 comprises a dielectric material (e.g., silicon nitride, silicon dioxide) to prevent the TSV 128 from electrically leaking into the third substrate 108c and near the third semiconductor device 110c. In some embodiments, the uppermost and lowermost surfaces of the TSV 128 may be uncovered by the TSV lining 130 to allow electrical signals to travel through the TSV 128 from the lowermost surface to the uppermost surface such that the TSV 128 is electrically coupled to at least the first and third interconnect structures 112a, 112c. Further, the TSV 128 may be in direct contact with a chemical barrier layer 129 to prevent the TSV 128 from chemically leaking (e.g., diffusing) into the third substrate 108c. In some embodiments, the chemical barrier layer 129 may comprise, for example, tantalum nitride.

In some embodiments, the additional bonding structure 126 may further comprise a backside contact 132. The backside contact 132 may extend from an interconnect wire 114 of the additional bonding structure 126 towards the backside 108s of the third substrate 108c. In some embodiments, the backside contact 132 extends into the backside 108s of the third substrate 108c. The backside contact 132 may be surrounded by a glue layer 131 to aid in the adhesion between the backside contact 132 and the third substrate 108c. In some embodiments, the glue layer 131 may comprise, for example, titanium or titanium nitride. The glue layer 131 is thinner than the TSV lining 130 and the chemical barrier layer 129. The backside contact 132 is spaced apart from active areas of the third semiconductor device 110c to avoid electrical interference with third semiconductor device 110c. The backside contact 132 may not use an electrical isolation barrier layer in some embodiments because, for example, the backside contact 132 contacts a small area of the third substrate 108c compared to that of the TSV 128.

It will be appreciated that during operation of the third semiconductor device 110c, heat may be generated. Thus, in some embodiments, a heat dissipation path 134 may include the backside contact 132 that is arranged near the third semiconductor device 110c to allow any heat within the third substrate 108c to dissipate away from the third semiconductor device 110c and out of the third substrate 108c. The heat may then follow continue through various heat dissipation paths 134 to exit the third substrate 108c and dissipate out of the 3D IC stack through the backside 108s of at least one of the first or second substrates 108a, 108b. Because the glue layer 131 is thinner than the TSV lining 130 and the chemical barrier layer 129, heat will dissipate more quickly into the backside contact 132 than into the TSV 128. Therefore, the heat dissipation paths 134 are the more efficient than a TSV dissipation path (not shown), where generated heat would dissipate through the TSV lining 130 and chemical barrier layer 129 from the third substrate 108c. Thus, the backside contact 132 may provide a more efficient heat dissipation path 134 to reduce thermal degradation to the 3D IC stack, thereby improving the lifetime of the 3D IC stack.

Figure 1B:
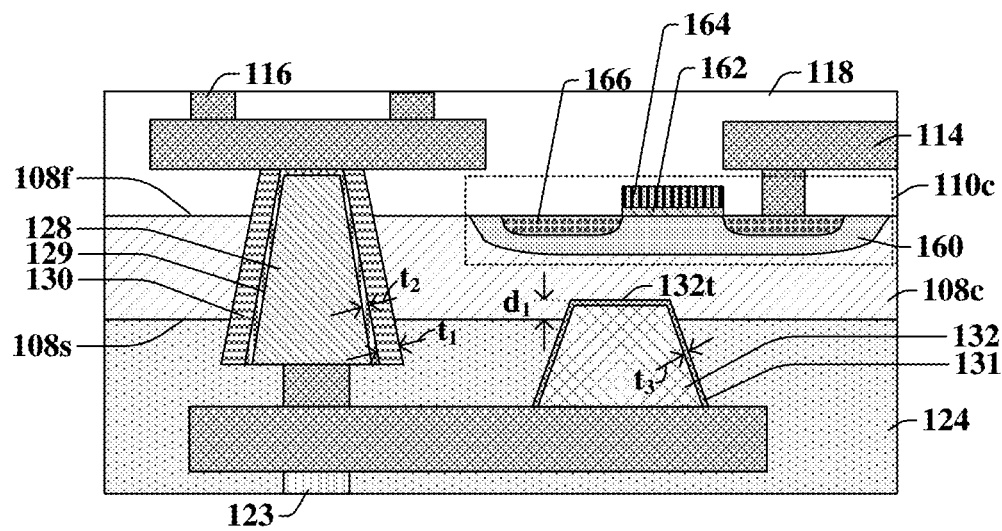

FIG. 1B illustrates a cross-sectional view 100B of some embodiments that correspond to box B in the cross-sectional view 100A of FIG. 1A to highlight features of the backside contact 132.

In some embodiments, the semiconductor device 110 may be, for example, a metal oxide semiconductor field effect transistor (MOSFET). In such example embodiments, the third semiconductor device 110c may comprise a doped well region 160 within the third substrate 108c, wherein the doped well region 160 is more heavily doped and/or has a different doping type than the third substrate 108c. Source/drain regions 166 may reside in the doped well region 160, and a gate electrode 164 over a gate dielectric layer 162 may be arranged on the frontside 108f of the third substrate 108c. The backside contact 132 has a topmost surface 132t, which may be defined as a topmost surface of the glue layer 131, that is spaced apart from the third semiconductor device 110c such that the backside contact 132 does not electrically interfere with the third semiconductor device 110c. Therefore, in some embodiments, the glue layer 131 and the backside contact 132 contact an area of the third substrate 108c that has a different doping concentration and/or different doping type than active areas (e.g., doped well region 160, source/drain regions 166) of the third semiconductor device 110c in the third substrate 108c. In some embodiments, the topmost surface 132t of the backside contact 132 extends into the backside 108s of the third substrate 108c by a first distance di.

In some embodiments, the TSV lining 130 may have a first thickness $t_1$ in a range of between, for example, approximately 200 angstroms and approximately 2000 angstroms, and the chemical barrier layer 129 may have a second thickness $t_2$ in a range of between, for example, approximately 50 angstroms and approximately 500 angstroms. In some embodiments, the glue layer 131 may have a third thickness $t_3$ in a range of between, for example, approximately 20 angstroms and approximately 300 angstroms. In some embodiments, the first thickness $t_1$ is greater than the third thickness $t_3$. Further, in some embodiments, the third thickness $t_3$ is less than at least the sum of the first thickness $t_1$ and the second thickness $t_2$.

Figure 1C:
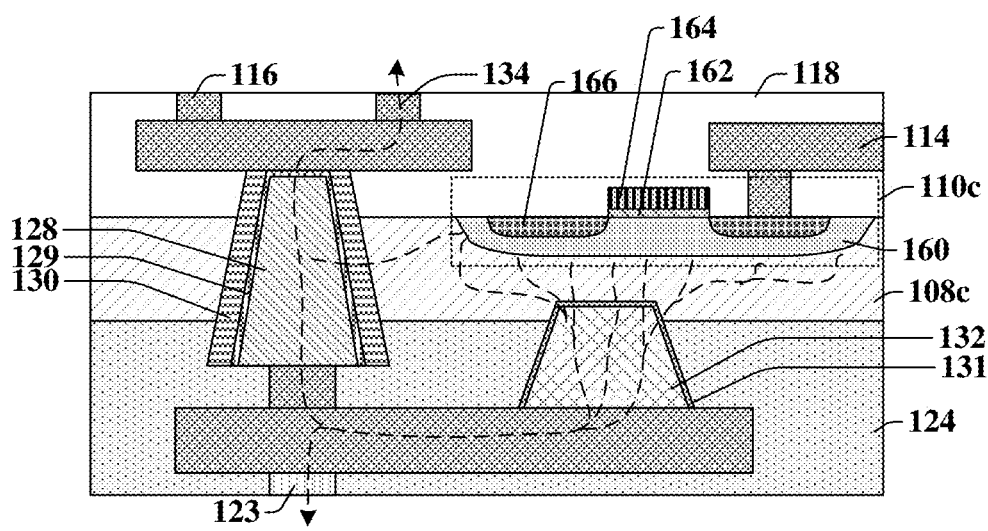

FIG. 1C illustrates a cross-sectional view 100C that may correspond to the cross-sectional view 100B of FIG. 1B and further includes some embodiments of heat dissipation paths 134 between the third semiconductor device 110c, backside contact 132, and TSV 128.

In some embodiments, the TSV 128 and the backside contact 132 have higher thermal conductivities than materials of the TSV lining 130, the chemical barrier layer 129, and the glue layer 131. Thus, the quicker heat reaches the backside contact 132 or the TSV 128, the quicker heat can dissipate away from the third semiconductor device 110c. Because the glue layer 131 is thinner than the TSV lining 130 and the chemical barrier layer 129, it is more thermally efficient for any generated heat from the third semiconductor device 110c to escape the third substrate 108c through the backside contact 132 than through the TSV 128. Thus, in some embodiments, the backside contact 132 is in direct contact and thermally coupled with one of the interconnect wires 114 in order to continue to dissipate heat, such that the heat dissipation paths 134 go through the backside contact 132 and continue through other thermally conductive materials (e.g., interconnect wires 114, interconnect vias 116, TSV 128, bonding vias 123, etc.) for heat to dissipate away from the third semiconductor device 110c during operation. Thus, some heat may dissipate from the third substrate 108c through the TSV lining 130 and the chemical barrier layer 129; however, more heat will dissipate from the third substrate 108c and through the glue layer 131 and the backside contact 132 because of the thickness of the glue layer 131 is less than the thickness of the TSV lining 130 and the chemical barrier layer 129.

Figure 2:
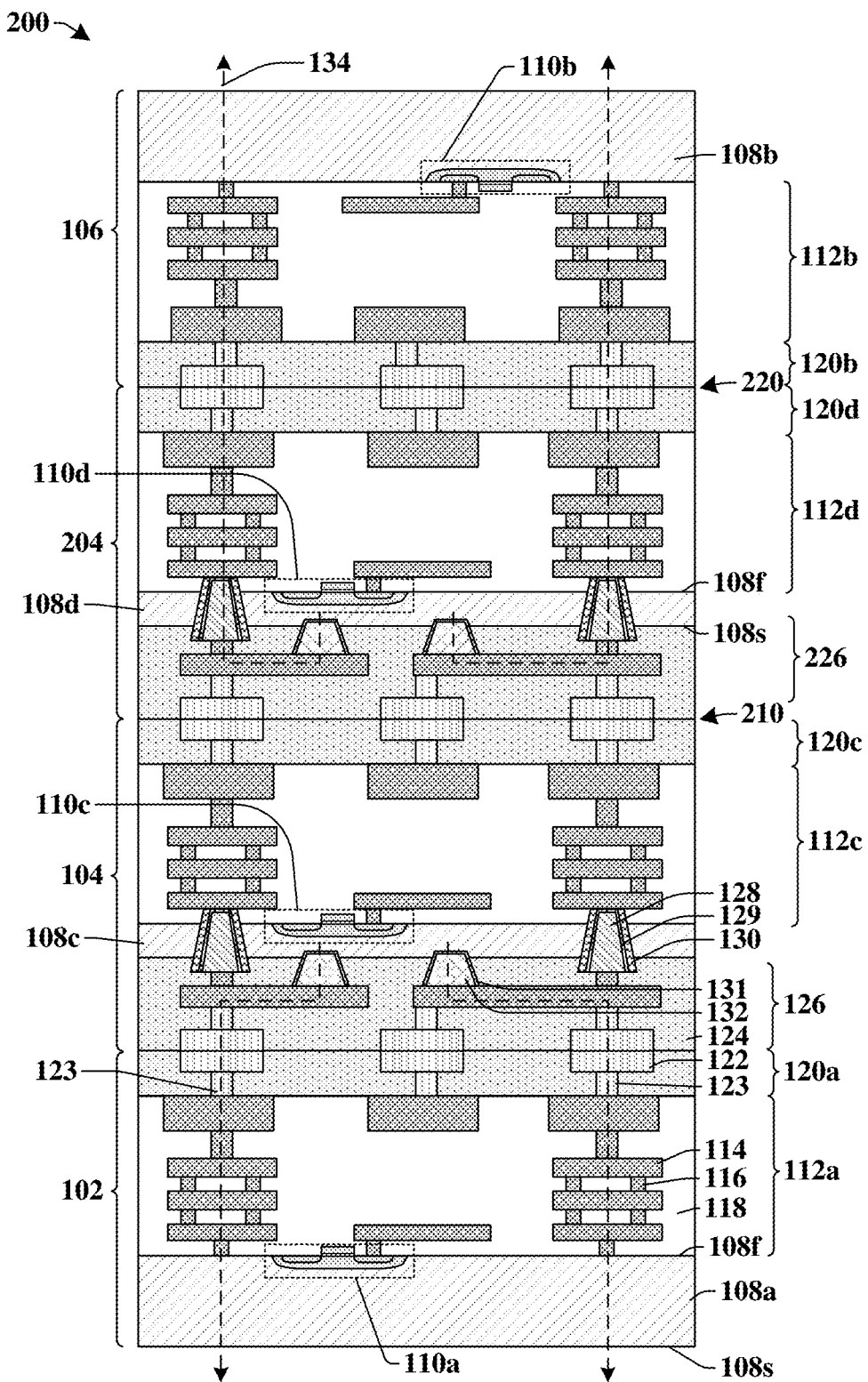
FIG. 2 illustrates cross-sectional view of some additional embodiments of a 3D IC stack comprising front-to-back bonded third and fourth IC dies having two backside contacts.

FIG. 2 illustrates a cross-sectional view 200 of some embodiments of a 3D IC stack comprising third and fourth IC dies having a front-to-back bond.

The 3D IC stack in cross-sectional view 200 includes a first IC die 102, a third IC die 104 arranged over and bonded to the first IC die 102, a fourth IC die 204 arranged over and bonded to the third IC die 104, and a second IC die 106 arranged over and bonded to the fourth IC die 204. In some embodiments, the fourth IC die 204, like the third IC die 104, comprises a fourth additional bonding structure 226. The fourth additional bonding structure 226 may be disposed on a backside 108s of a fourth substrate 108d of the fourth IC die 204. In some embodiments, the fourth additional bonding structure 226 of the fourth IC die 204 may be bonded to the third bonding structure 120c at a front-to-back interface 210, indicating that the frontside 108f of the third substrate 108c of the third IC die 104 is facing the backside 108s of the fourth substrate 108d. Further, the second bonding structure 120b may be bonded to a fourth bonding structure 120d at a front-to-front interface 220, indicating that the frontside 108f of the second substrate 108b is facing the frontside 208f of the fourth substrate 108d.

It will be appreciated that some embodiments of a 3D IC stack comprise more than the third and fourth IC dies 104, 204 bonded to one another at varying interface types (e.g., front-to-front, front-to-back). Nevertheless, in some embodiments, each of the third IC die 104 and the fourth IC die 204 may comprise a backside contact 132 to provide access to a heat dissipation path 134 that efficiently dissipates any generated heat by a semiconductor device (e.g., 110c, 110d) away from the semiconductor device (e.g., 110c, 110d). In some embodiments, the backside contact 132 may be coupled to a TSV 128 such that the heat dissipation path 134 goes through the TSV 128. In some embodiments, the heat dissipation path 134 may be shorter, and thus more efficient, without going through the TSV 128, for example, as shown between the third substrate 108c and the first substrate 108a.

In some embodiments, the third substrate 108c and the fourth substrate 108d may comprise two TSVs 128 and two backside contacts 132. However, it will be appreciated, that the number of TSVs 128 may depend on the design of the 3D IC stack and that the number of backside contacts 132 may depend on the amount of heat generated by the semiconductor device (e.g., 110c, 110d) during operation and/or other design requirements (e.g., number of TSVs, width of substrates, size of semiconductor device, etc.). Thus, the number of TSVs 128 and the number of backside contacts 132 may vary from what is shown in the cross-sectional view 200 of FIG. 2. Further, in some embodiments, as depicted in the cross-sectional view 200 of FIG. 2, each of the IC dies (102, 104, 204, 106) may have the same or about the same IC designs of the location of the semiconductor devices (110a, 110b, 110c, 110d), the interconnect structures (112a, 112b, 112c, 112d), and the bonding structures (120a, 120b, 120c, 120d). In such embodiments, when the IC dies (102, 104, 204, 106) are vertically stacked, heat may build up even faster. Thus, for example, a 3D IC stack may comprise more backside contacts 132 in embodiments where IC dies (102, 104, 204, 106) have the same or about the same die designs than IC dies that have differing IC designs. Further, depending on the IC die designs, in some embodiments, each of the third and fourth IC dies 104, 204 may comprise a same or different number of backside contacts 132. Nevertheless, the backside contacts 132 in a 3D IC stack may provide an entry to a heat dissipation path 134 for efficient heat dissipation at least away from the third and fourth semiconductor devices 110c, 110d.

Figure 3:
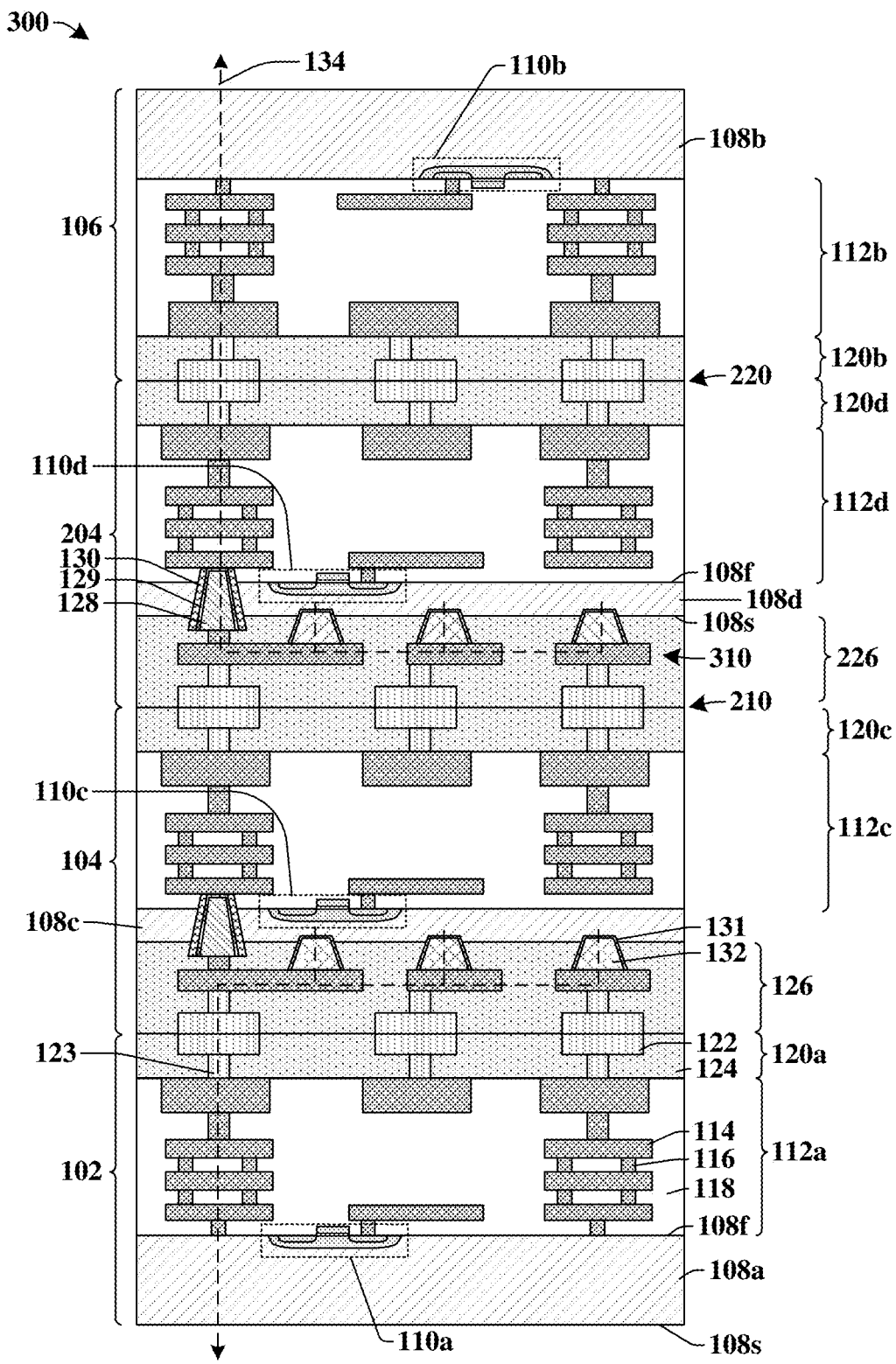
FIG. 3 illustrates a cross-sectional view of some additional embodiments of a 3D IC stack comprising front-to-back bonded third and fourth IC dies having three backside contacts.

FIG. 3 illustrates a cross-sectional view 300 of some additional embodiments of a 3D IC stack comprising third and fourth IC dies having a front-to-back bond, wherein each of the third substrate 108c and the fourth substrate 108d comprise three backside contacts 132 and one TSV 128.

In some embodiments, the backside contacts 132 in the third and fourth bonding structures 120c, 120d are coupled to interconnect wires 114 at a same interconnect wire level 310 of the third and fourth bonding structures 120c, 120d. Although the interconnect wires 114 at the interconnect wire level 310 are not continuously connected in the cross-sectional view 300, it will be appreciated that each of the interconnect wires 114 at the interconnect wire level 310 of the third and fourth bonding structures 120c, 120d are electrically coupled through other portions of the interconnect wires 114 not visible in the cross-sectional view 300 due to layout design. In other embodiments, the interconnect wire 114 at the interconnect wire level 310 of each of the third and fourth bonding structures 120c, 120d may be continuously connected from the cross-sectional view 300. By coupling the backside contacts 132 to the interconnect wires 114 at the interconnect wire level 310, any heat in the third substrate 108c and the fourth substrate 108d may dissipate away from the third and fourth semiconductor devices 110c, 110d and through at least one of the first, second, third or fourth interconnect structures 112a, 112b, 112c, 112d.

Figure 4:
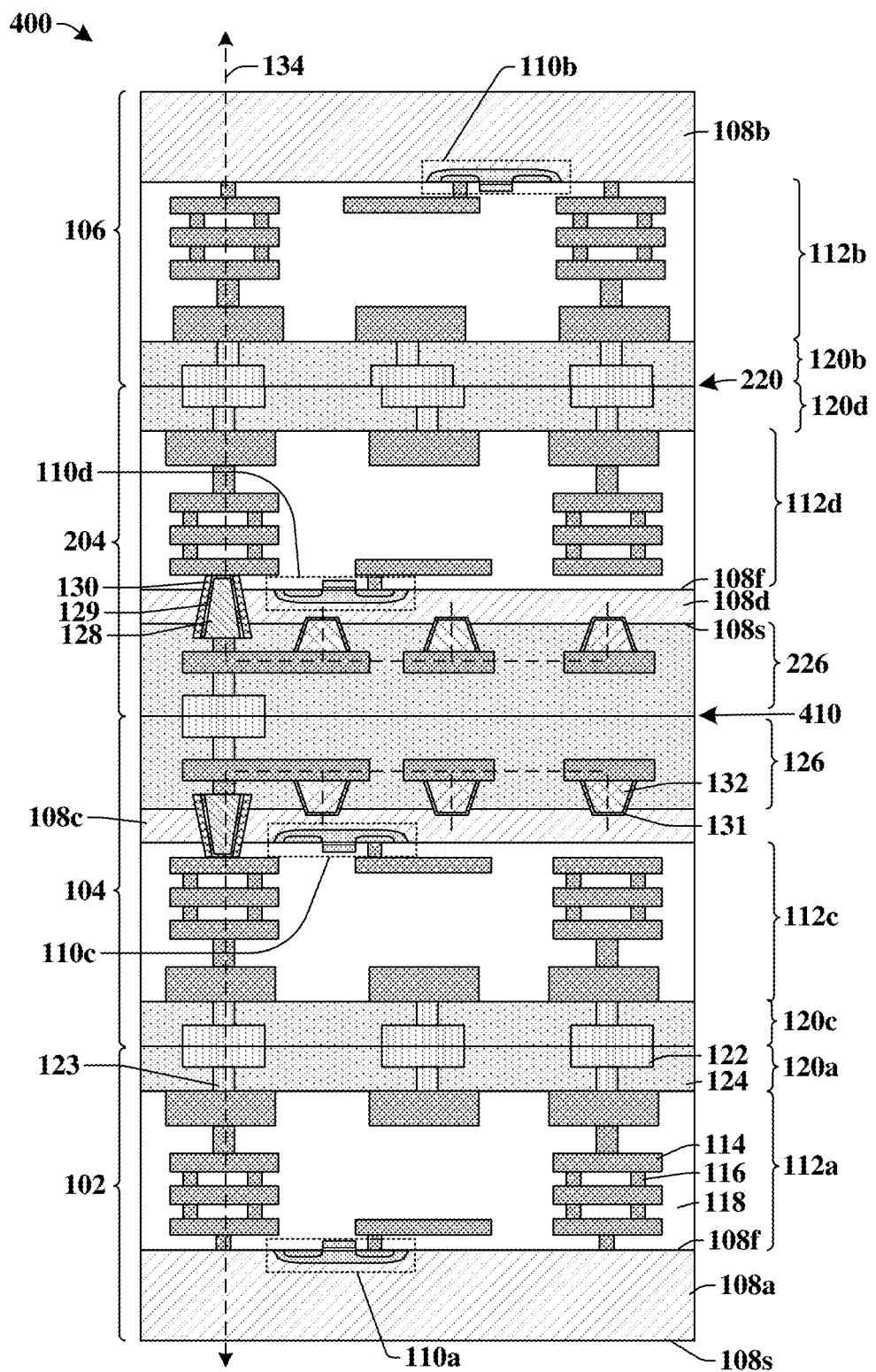
FIG. 4 illustrates a cross-sectional view of some additional embodiments of a 3D IC stack comprising back-to-back bonded third and fourth IC dies having backside contacts.

FIG. 4 illustrates a cross-sectional view 400 of some embodiments of a 3D IC stack comprising third and fourth IC dies having a back-to-back bond.

In some embodiments, the additional bonding structure 126 of third IC die 104 may be bonded to the fourth additional bonding structure 226 of the fourth IC die 204 along a back-to-back interface 410, indicating that the backside 108s of the third substrate 108c is facing the backside 108s of the fourth substrate 108d.

FIGS. 5-20 illustrate cross-sectional views 500-2000 of some embodiments of a method of forming an integrated circuit (IC) die having a backside contact coupled to a through substrate via. Although FIGS. 5-20 are described in relation to a method, it will be appreciated that the structures disclosed in FIGS. 5-20 are not limited to such a method, but instead may stand alone as structures independent of the method.

Figure 5:
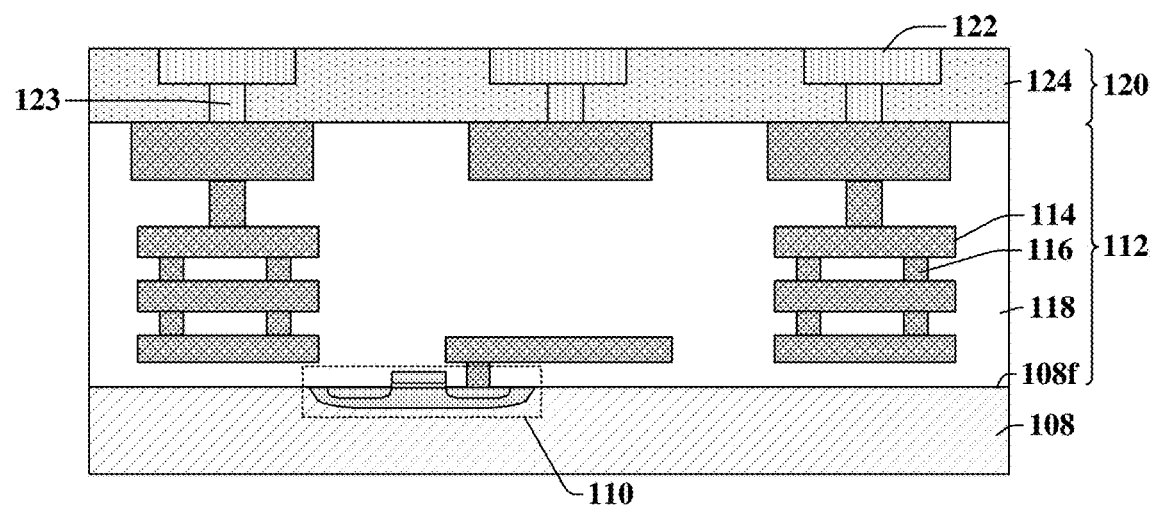
FIGS. 5-20 illustrate cross-sectional views of some embodiments of a method of forming a 3D IC stack, wherein a third IC die comprises a backside contact coupled to a through substrate via.

As shown in cross-sectional view 500 of FIG. 5, a semiconductor substrate 108 is provided. In some embodiments, the semiconductor substrate 108 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, the semiconductor substrate 108 may have a thickness in a range of between, for example, approximately 2.4 micrometers and approximately 3 micrometers. On a frontside 108f of the semiconductor substrate 108, a semiconductor device 110 may be deposited. In some embodiments, the semiconductor device 110 may be, for example, a transistor, a capacitor, a resistor, or the like. An interconnect structure 112 may be deposited over the semiconductor device 110 and on the frontside 108f of the semiconductor substrate 108, the interconnect structure 112 comprising interconnect vias 116 and interconnect wires 114 embedded within an interconnect dielectric structure 118. In some embodiments, the interconnect structure 112 may have a thickness in a range of between, for example, approximately 5 micrometers and approximately 8 micrometers.

In some embodiments, the interconnect vias 116 and interconnect wires 114 comprise a same material that is conductive. For example, in some embodiments, the interconnect vias 116 and interconnect wires 114 comprise copper. Because copper is known to chemically diffuse into the surrounding interconnect dielectric structure 118, a thin barrier layer may separate each of the interconnect vias 116 and interconnect wires 114 from the interconnect dielectric structure 118. For example, in some embodiments, the thin barrier layer may comprise tantalum nitride to chemically isolate (e.g., prevent diffusion) the interconnect vias 116 and interconnect wires 114 from the interconnect dielectric structure 118. In other embodiments, the interconnect vias 116 and interconnect wires 114 may comprise other conductive materials such as, for example, tungsten, aluminum, or the like. In some embodiments, the interconnect dielectric structure 118 may comprise a dielectric material, such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. Further, a bonding structure 120 may be formed over the interconnect structure 112. In some embodiments, the bonding structure 120 may comprise bonding vias 123 and bonding wire layers 122 embedded within a bonding dielectric structure 124. In some embodiments, the bonding vias 123, the bonding wire layers 122, and the bonding dielectric structure 124 comprise the same materials as the interconnect vias 116, the interconnect wires 114, and the interconnect dielectric structure 118, respectively. In some embodiments, the interconnect wires 114 may be coupled to the bonding vias 123. In some embodiments, the bonding structure 120 may have a thickness is a range of between, for example, approximately 1.5 micrometers and approximately 2 micrometers.

Figure 6:
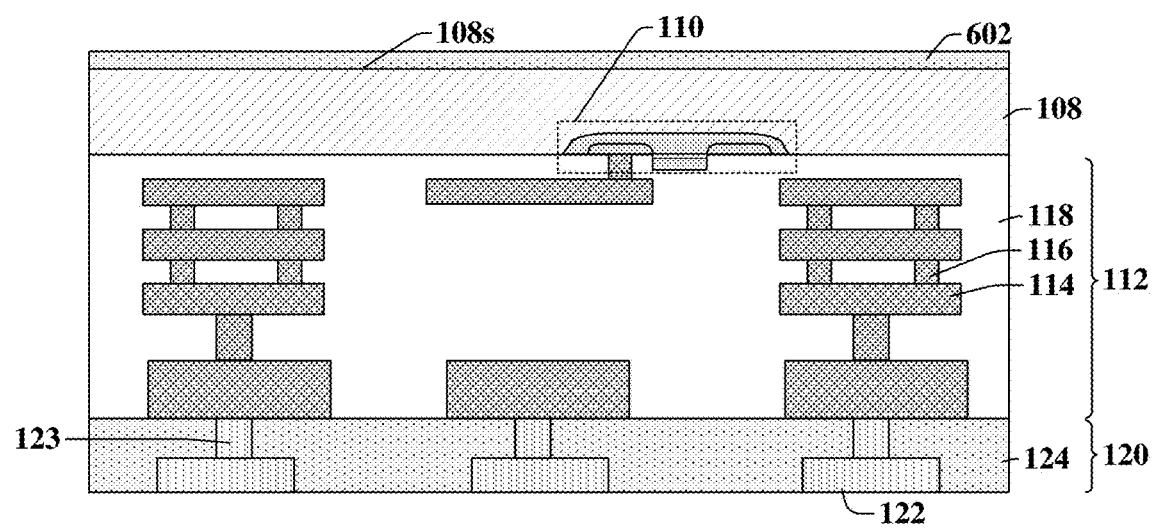

As shown in cross-sectional view 600 of FIG. 6, the semiconductor substrate 108 is flipped such that a backside 108s of the semiconductor substrate 108 may be processed. A first dielectric layer 602 may be deposited on the backside 108s of the semiconductor substrate 108. The first dielectric layer 602 may comprise a dielectric material, such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the first dielectric layer 602 may comprise a same material as the bonding dielectric structure 124. The first dielectric layer may be formed by way of vapor deposition processes (e.g., chemical vapor deposition (CVD), physical vapor deposition (PVD), atomic layer deposition (ALD), etc.).

Figure 7:
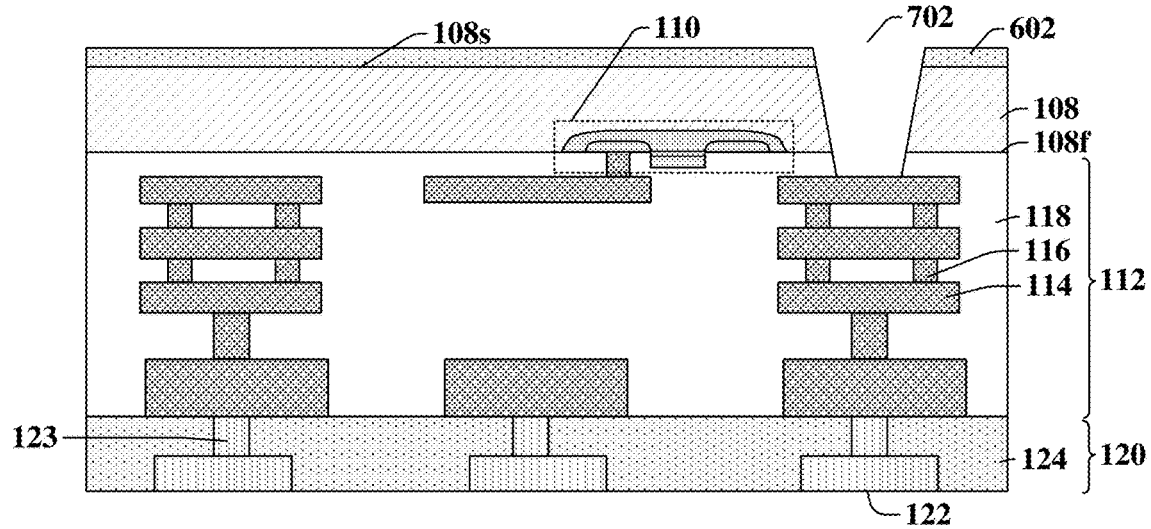

As shown in cross-sectional view 700 of FIG. 7, a first opening 702 is formed that extends completely through the first dielectric layer 602 and the semiconductor substrate 108. The first opening 702 may be formed through a selective patterning process according to a masking layer (not shown) formed over the first dielectric layer 602. For example, in some embodiments, the masking layer may comprise a photosensitive material (e.g., photoresist) formed by a spin coating process. In such embodiments, the layer of photosensitive material is selectively expose to electromagnetic radiation according to a photomask. The electromagnetic radiation modifies a solubility of exposed regions within the photosensitive material to define soluble regions. The photosensitive material is subsequently developed to define openings within the photosensitive material by removing the soluble regions. In other embodiments, the masking layer may comprise a hard mask layer (e.g., a silicon nitride layer, a silicon carbide layer, or the like). An etching process would then be performed according to the openings in the masking layer. In the cross-sectional view 700 of FIG. 7, the etching process (e.g., wet etch, dry etch) would remove portions of the first dielectric layer 602, the semiconductor substrate 108, and the interconnect dielectric structure 118, thereby forming the first opening 702. The first opening 702 exposes one of the interconnect wires 114 in the interconnect structure 112. Further, the first opening 702 is spaced away from the semiconductor device 110 to avoid interfering with and/or damaging the semiconductor device 110.

Figure 8:
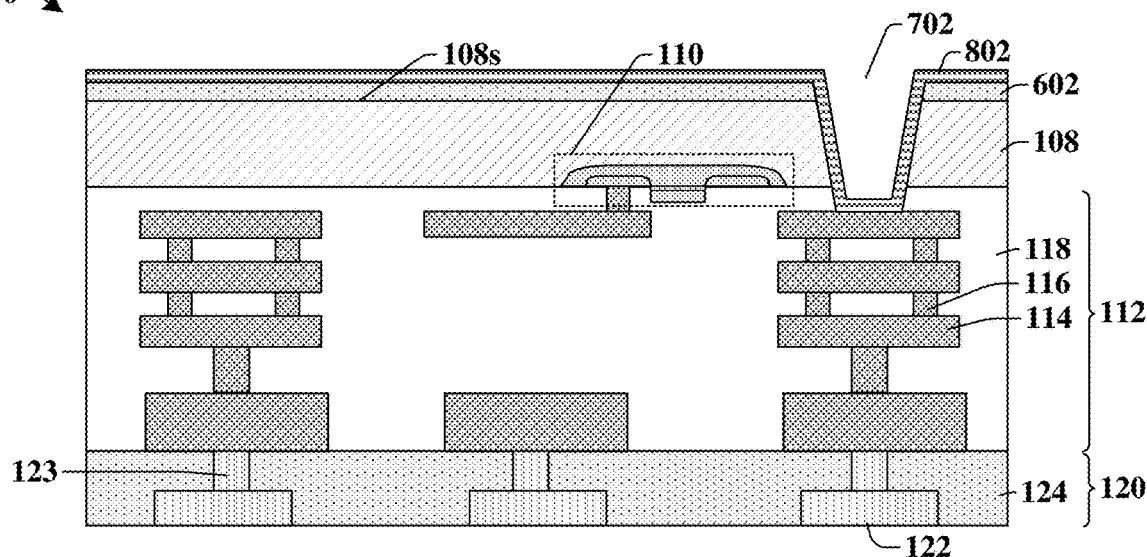

As shown in cross-sectional view 800 of FIG. 8, an electrical insulator layer 802 is deposited over the first dielectric layer 602 and within the first opening 702. In some embodiments, the electric insulator layer 802 comprises, for example, silicon dioxide, silicon nitride, aluminum oxide, or some other electrical insulator material. In some embodiments, the electrical insulator layer 802 may be deposited by way of vapor deposition processes (e.g., CVD, PE-CVD, PVD, ALD, etc.).

Figure 9:
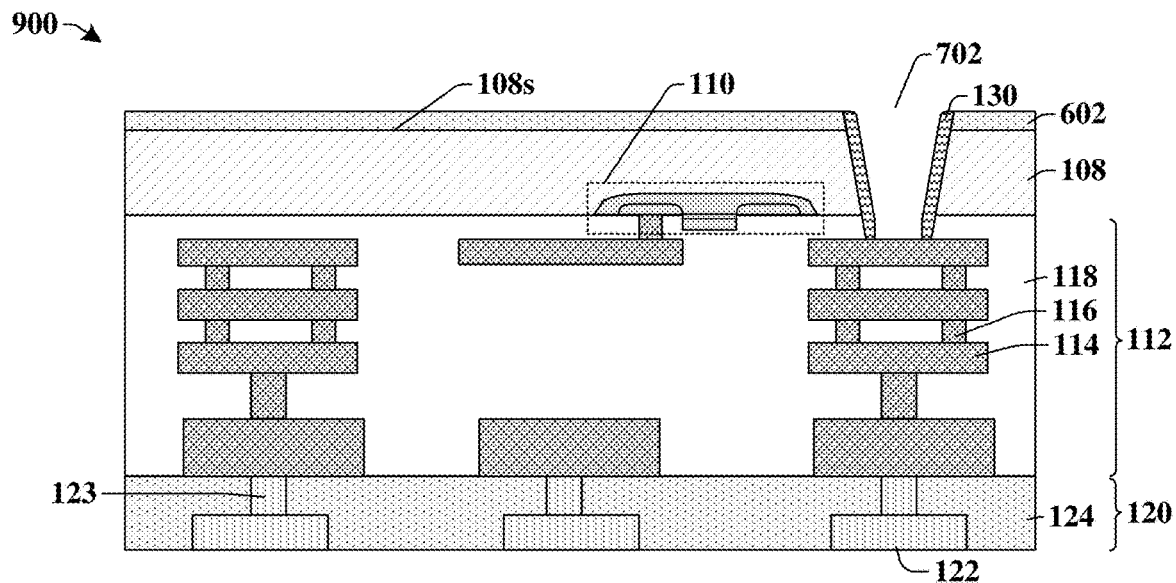

As shown in cross-sectional view 900 of FIG. 9, horizontal portions of the electrical insulator layer (802 of FIG. 8) are removed, thereby forming a through substrate via (TSV) lining 130 within the first opening 702. In some embodiments, the horizontal portions of the electrical insulator layer (802 of FIG. 8) may be removed using a vertical etch process (e.g., vertical dry etch), such that a masking layer is not needed. In some embodiments, from the cross-sectional view 900, after the vertical etch process, the remaining TSV lining 130 may have upper inner corners that are rounded. Nevertheless, the TSV lining 130 may completely cover inner sidewalls of the semiconductor substrate 108 that were exposed from the formation of the first opening 702 to provide electrical insulation in the horizontal direction.

Figure 10:
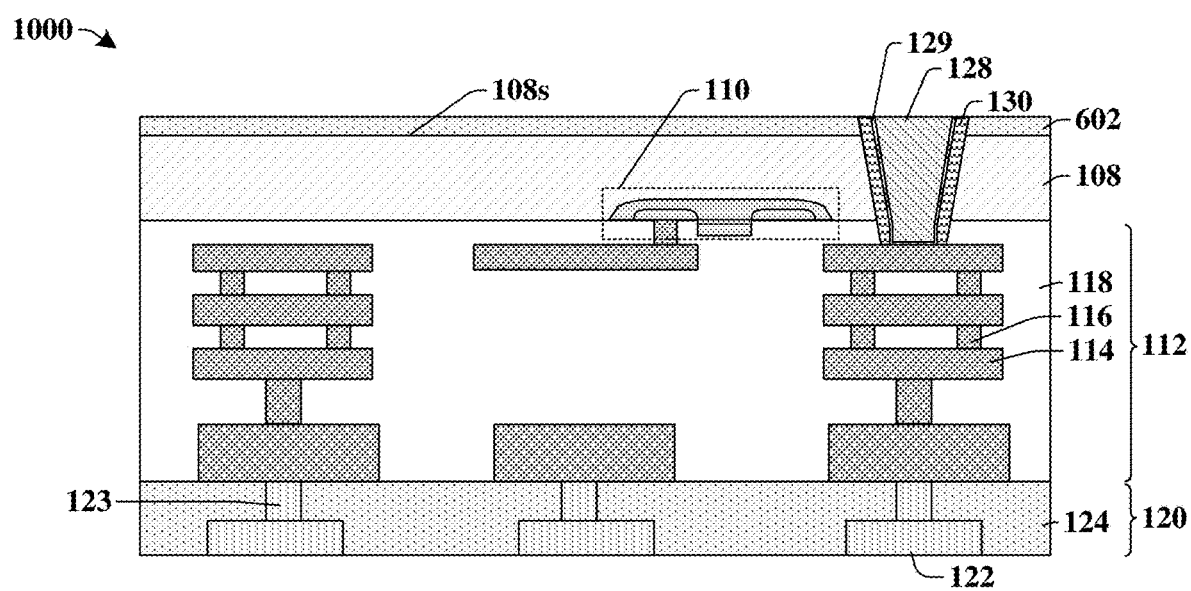

As shown in cross-sectional view 1000 of FIG. 10, the first opening (702 of FIG. 9) is filled with a conductive material to form a through substrate via (TSV) 128. In some embodiments, a chemical barrier layer 129 is deposited first in the first opening (702 of FIG. 9) by way of, for example, a vapor deposition process (e.g., CVD, PE-CVD, PVD, ALD, sputtering, etc.). The chemical barrier layer 129 may comprise, for example, tantalum or tantalum nitride and have a thickness in a range of between, for example, approximately 50 angstroms and approximately 500 angstroms. Then, in some embodiments, the conductive material of the TSV 128 may comprise, for example, copper. The TSV 128 is formed by depositing the conductive material over the first dielectric layer 602, on the chemical barrier layer 129, and within the first opening (702 of FIG. 9) by way of, for example, a vapor deposition process (e.g., CVD, PE-CVD, PVD, ALD, sputtering, etc.). Then, a planarization process (e.g., chemical mechanical planarization (CMP)) may be used to remove excess conductive material and any extra material of the deposited chemical barrier layer, such that the TSV 128 has an upper surface substantially coplanar with the first dielectric layer 602. Outermost sidewalls of the chemical barrier layer 129 are surrounded by the TSV lining 130 such that the TSV 128 does not directly contact the semiconductor substrate 108. The chemical barrier layer 129 may prevent the TSV 128 from diffusing into the semiconductor substrate 108, and the TSV lining 130 may prevent any electrical signals traveling through the TSV 128 during operation from leaking into the semiconductor substrate 108. Thus, both the chemical barrier layer 129 and the TSV lining 130 prevent the TSV 128 from damaging and/or interfering with the semiconductor device 110. Further, the TSV 128 may be electrically coupled to the interconnect structure 112. In some embodiments, the TSV 128 may have a height that is in a range of between, for example, approximately 0.7 micrometers and approximately 3.2 micrometers. Because the TSV 128 extends completely through the semiconductor substrate 108, the TSV 128 has a height that is greater than the thickness of the semiconductor substrate 108.

Figure 11:
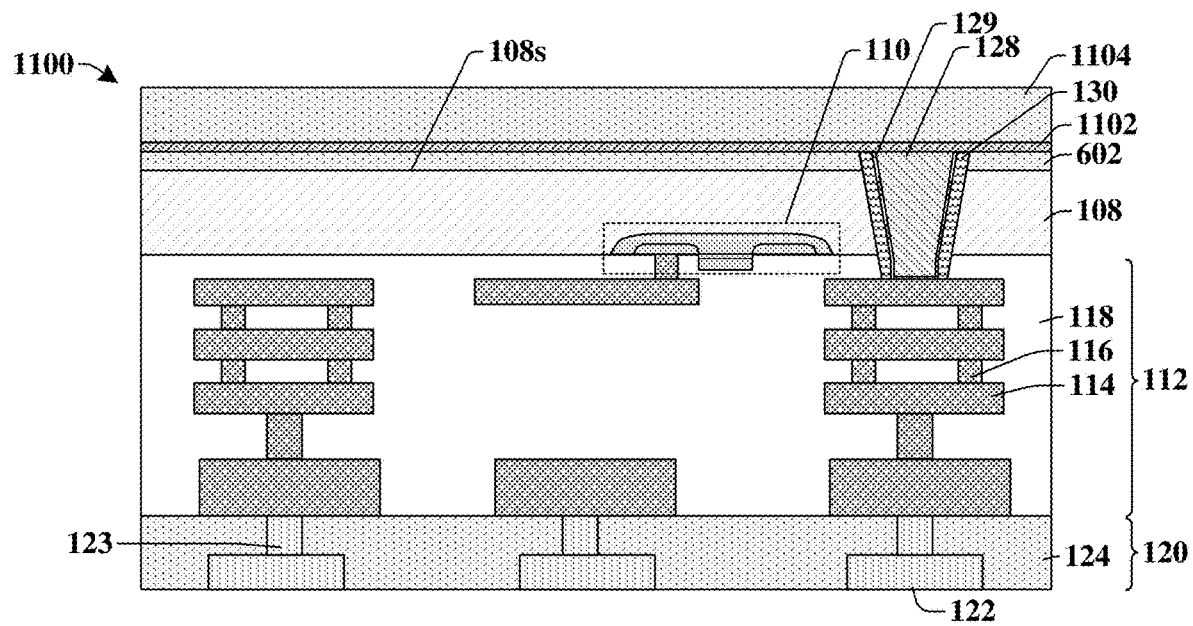

As shown in cross-sectional view 1100 of FIG. 11, a first etch stop layer 1102 may be deposited over the first dielectric layer 602 and the TSV 128, and a second dielectric layer 1104 may be deposited over the first etch stop layer 1102. In some embodiments, the first etch stop layer 1102 may comprise, for example, a nitride (e.g., silicon nitride), a carbide (e.g., silicon carbide), or the like.

Figure 12:
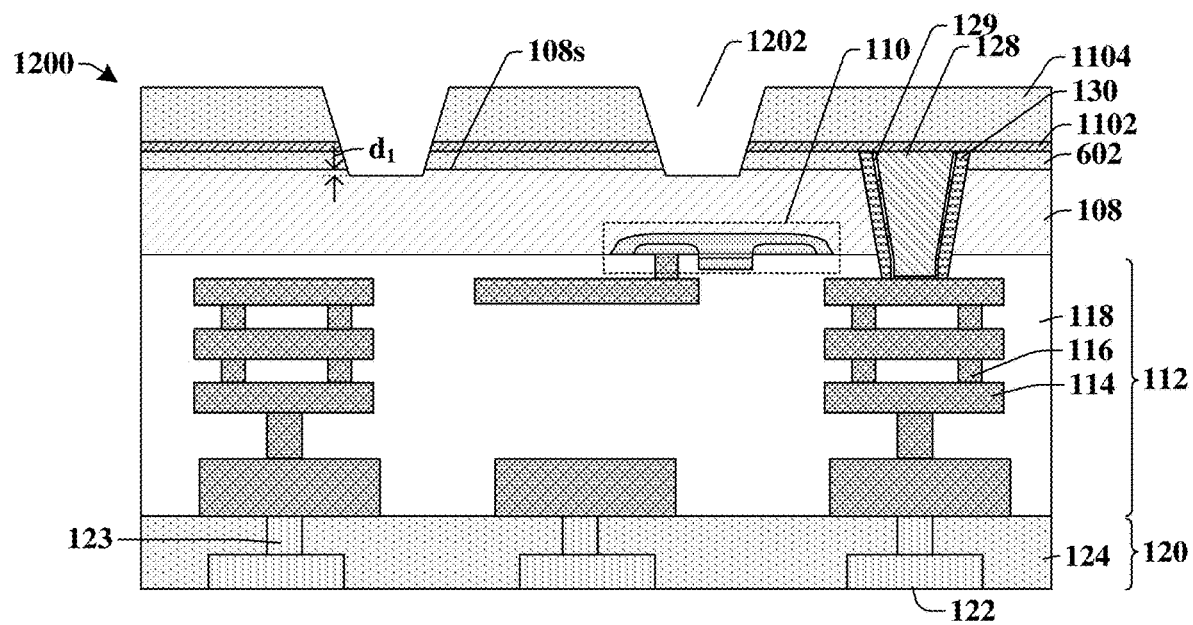

As shown in cross-sectional view 1200 of FIG. 12, second openings 1202 may be formed, that extend from the second dielectric layer 1104 to the backside 108s of the semiconductor substrate 108. The second openings 1202 expose the backside 108s of the semiconductor substrate 108. The second openings 1202 may be formed by a selective patterning process according to a masking layer (not shown), similar to the formation of the first opening 702 in FIG. 7. In some embodiments, the second openings 1202 extend into the backside 108s of the semiconductor substrate 108 by a first distance di. The second openings 1202 are laterally spaced from the TSV 128 and vertically spaced from the semiconductor device 110. In some embodiments, there are two second openings 1202, whereas in other embodiments, there is one second opening 1202 or greater than two second openings 1202 formed.

Figure 13:
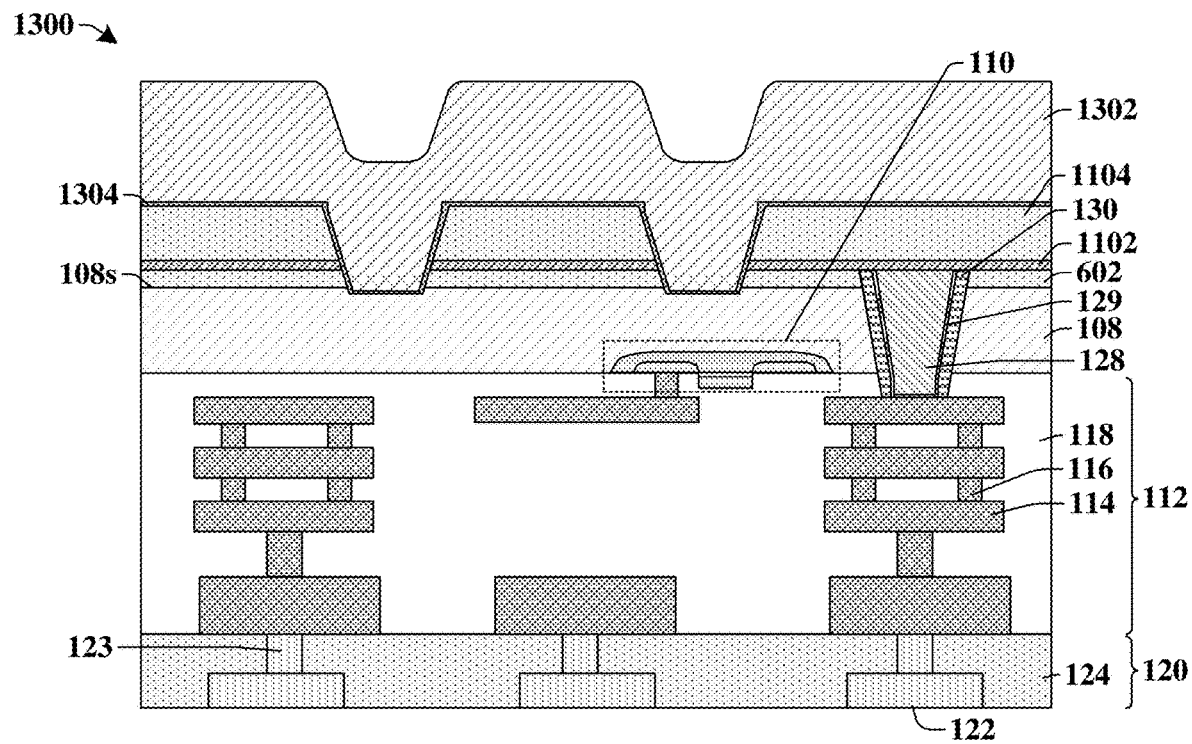

As shown in cross-sectional view 1300 of FIG. 13, a conformal glue layer 1304 and a second conductive material 1302 are deposited over the second dielectric layer 1104 and within the second openings (1202 of FIG. 12). In some embodiments, the conformal glue layer 1304 comprises, for example, titanium or titanium nitride, and has a thickness in a range of between, for example, approximately 20 angstroms and approximately 300 angstroms. In some embodiments, the second conductive material 1302 comprises, for example, tungsten. The conformal glue layer 1304 and/or the second conductive material 1302 may be deposited by way of, for example, a vapor deposition process (e.g., CVD, PE-CVD, PVD, ALD, sputtering, etc.).

Figure 14:
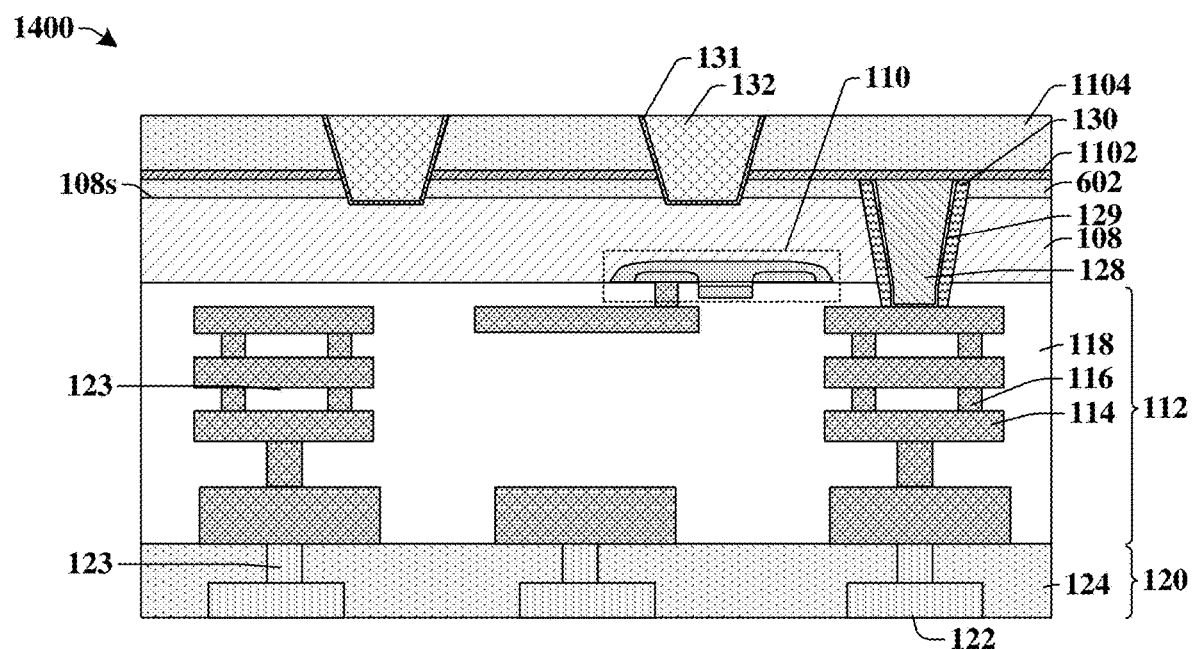

As shown in cross-sectional view 1400 of FIG. 14, the second conductive material (1302 of FIG. 13) disposed over a topmost surface of the second dielectric layer 1104 is removed, thereby forming backside contacts 132 surrounded by first and second dielectric layers 602, 1104 and extending into the backside 108s of the semiconductor substrate 108. In some embodiments, the second conductive material (1302 of FIG. 13) is removed by a planarization process (e.g., CMP), and thus, the backside contacts 132 may have a top surface that is substantially coplanar with the second dielectric layer 1104. In some embodiments, the backside contacts 132 may have a height in a range of between, for example, approximately 0.1 micrometers and approximately 1 micrometer. In some embodiments, the backside contacts 132 have bottommost surfaces that are below a topmost surface of the TSV 128 and have topmost surfaces above the topmost surface of the TSV 128 from the perspective shown in the cross-sectional view 1400.

Figure 15:
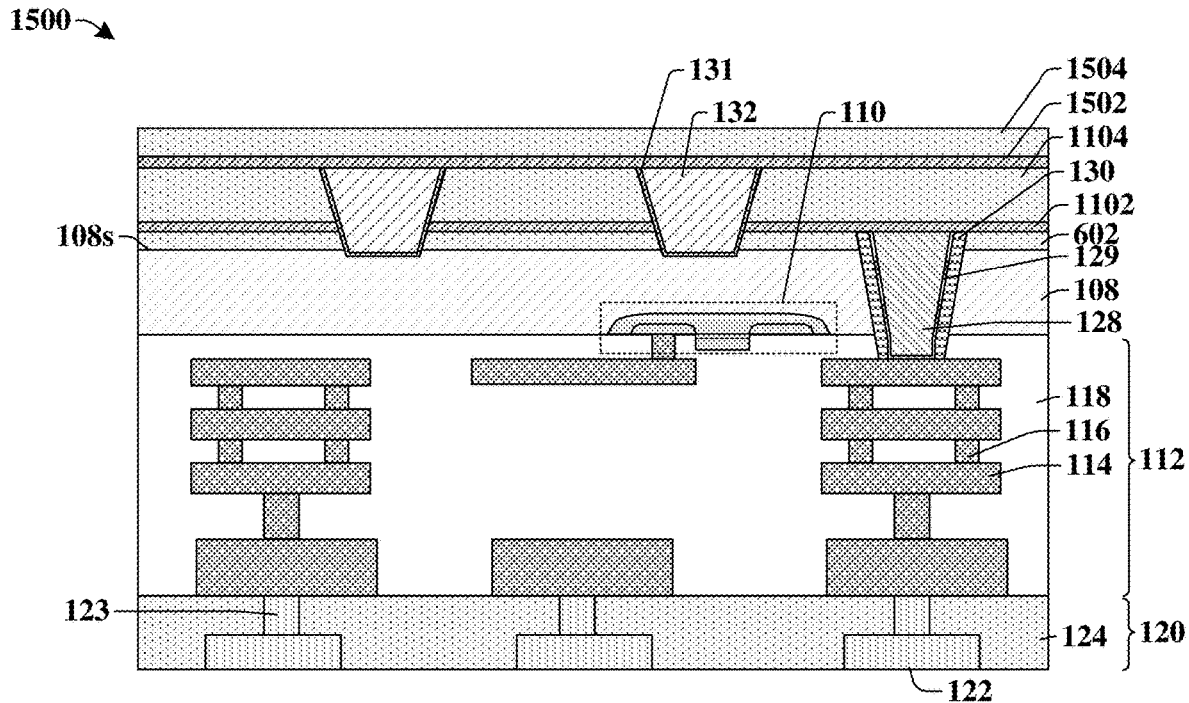

As shown in cross-sectional view 1500 of FIG. 15, a second etch stop layer 1502 may be deposited over the second dielectric layer 1104 and the backside contacts 132, and a third dielectric layer 1504 may be deposited over the second etch stop layer 1502. In some embodiments, the second etch stop layer 1502 and the third dielectric layer 1504 may respectively comprise the same materials as the first etch stop layer 1102 and as the second dielectric layer 1104.

Figure 16:
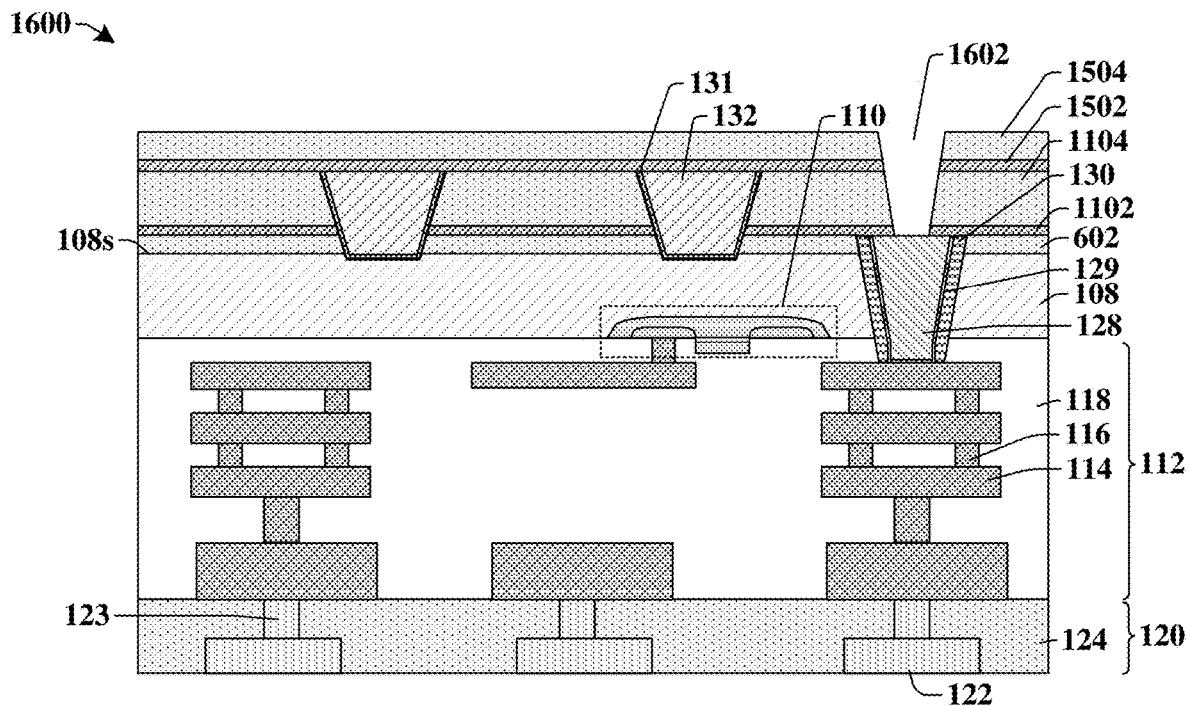

As shown in cross-sectional view 1600 of FIG. 16, a third opening 1602 may be formed that extends from a top surface of the third dielectric layer 1504 to a top surface of the TSV 128. Thus, in some embodiments, the third opening 1602 may directly overlie the TSV 128 and expose the top surface of the TSV 128. The third opening 1602 may be formed by a selective patterning process according to a masking layer (not shown), similar to the formation of the first opening 702 in FIG. 7.

Figure 17:
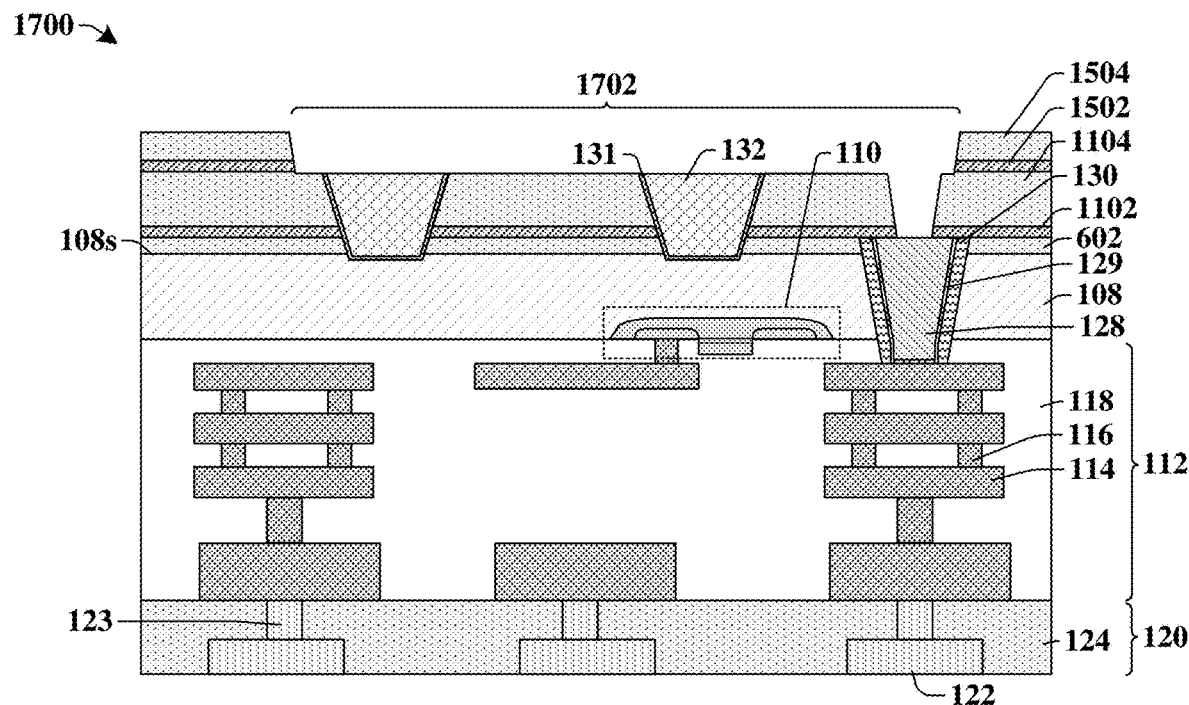

As shown in cross-sectional view 1700 of FIG. 17, a fourth opening 1702 may be formed that extend from the top surface of the third dielectric layer 1504 to top surfaces of the backside contacts 132. In some embodiments, the fourth opening 1702 laterally extends across the backside contacts 132 and the TSV 128. The fourth opening 1702 may be formed by a selective patterning process according to a masking layer (not shown), similar to the formation of the first opening 702 in FIG. 7.

Figure 18:
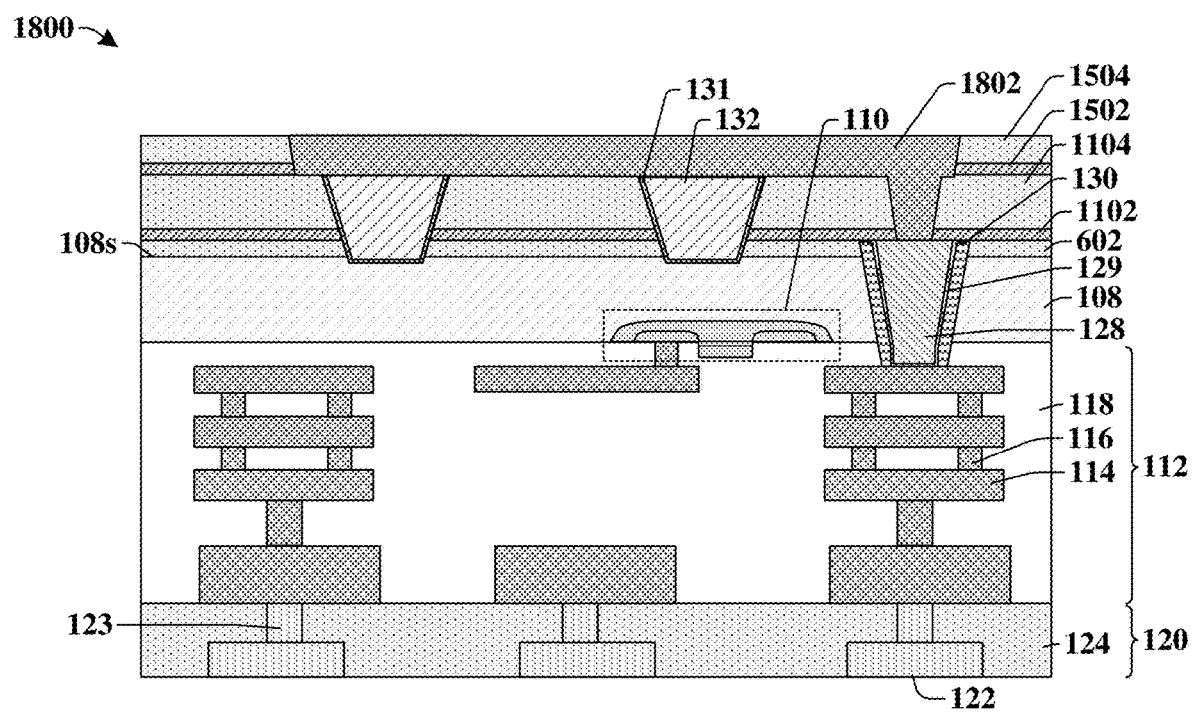

As shown in cross-sectional view 1800 of FIG. 18, a third conductive material is deposited into the fourth opening (1702 of FIG. 17) and subsequently planarzied such that a backside interconnect structure 1802 is formed. The formation of the backside interconnect structure 1802 illustrated in FIGS. 16-18 may be representative of a dual damascene process. Thus, the backside interconnect structure 1802 may comprise copper. Additionally, a barrier layer (not shown) may be surround the backside interconnect structure 1802 to chemically isolate the backside interconnect structure 1802 from the backside contacts 132, the TSV 128, and the surrounding dielectric layers (1104, 1504). The barrier metal layer may comprise, for example, tantalum nitride.

Figure 19:
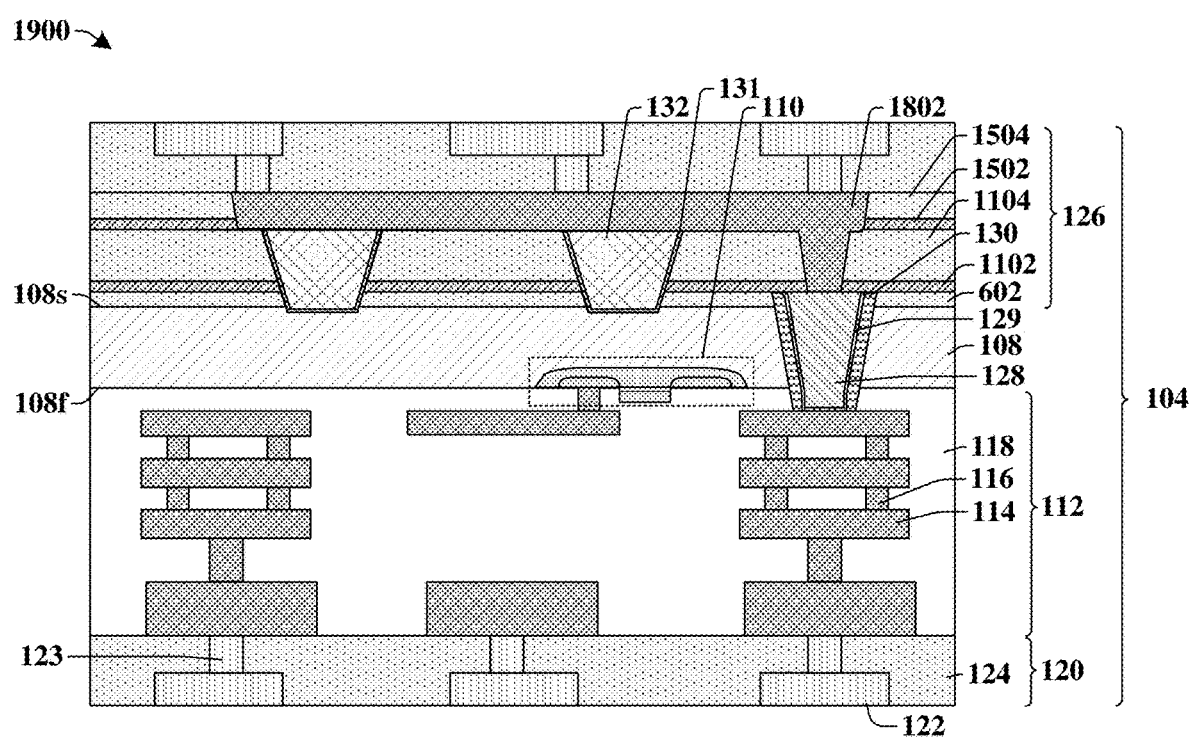

As shown in cross-sectional view 1900 of FIG. 19, in some embodiments, a bonding dielectric structure 124, bonding vias 123 and bonding wire layers 122 may also be formed over the third dielectric layer 1504 and the backside interconnect structure 1802. In some embodiments, the first, second, and third dielectric layers 602, 1104, 1504 may comprise the same dielectric material as the bonding dielectric structure 124. Further, in some embodiments, the bonding dielectric structure 124 may comprise the same dielectric material as the interconnect dielectric structure 118. In some embodiments, the bonding vias 123 and the bonding wire layers 122 may comprise a same conductive material as the backside interconnect structure 1802. The bonding vias 123 and the bonding wire layers 122 may also be formed by a dual damascene process, like the backside interconnect structure 1802. The bonding vias 123 and the bonding wire layers 122 may be coupled to the backside interconnect structure 1802, in some embodiments. Together, the backside contacts 132, backside interconnect structure 1802, bonding vias 123, bonding wire layers 122, and surrounding dielectric materials may make up an additional bonding structure 126 on the backside 108s of the semiconductor substrate 108. In some embodiments, the additional bonding structure 126 may have a height in a range of between, for example, approximately 3 micrometers and approximately 3.5 micrometers. Thus, in some embodiments, the additional bonding structure 126 may have a larger height than the bonding structure 120. Further, the illustrated IC die in FIG. 19 may be classified as a third IC die 104 because of bonding structures (120, 126) on both the frontside 108f and the backside 108s of the semiconductor substrate 108.

Figure 20:
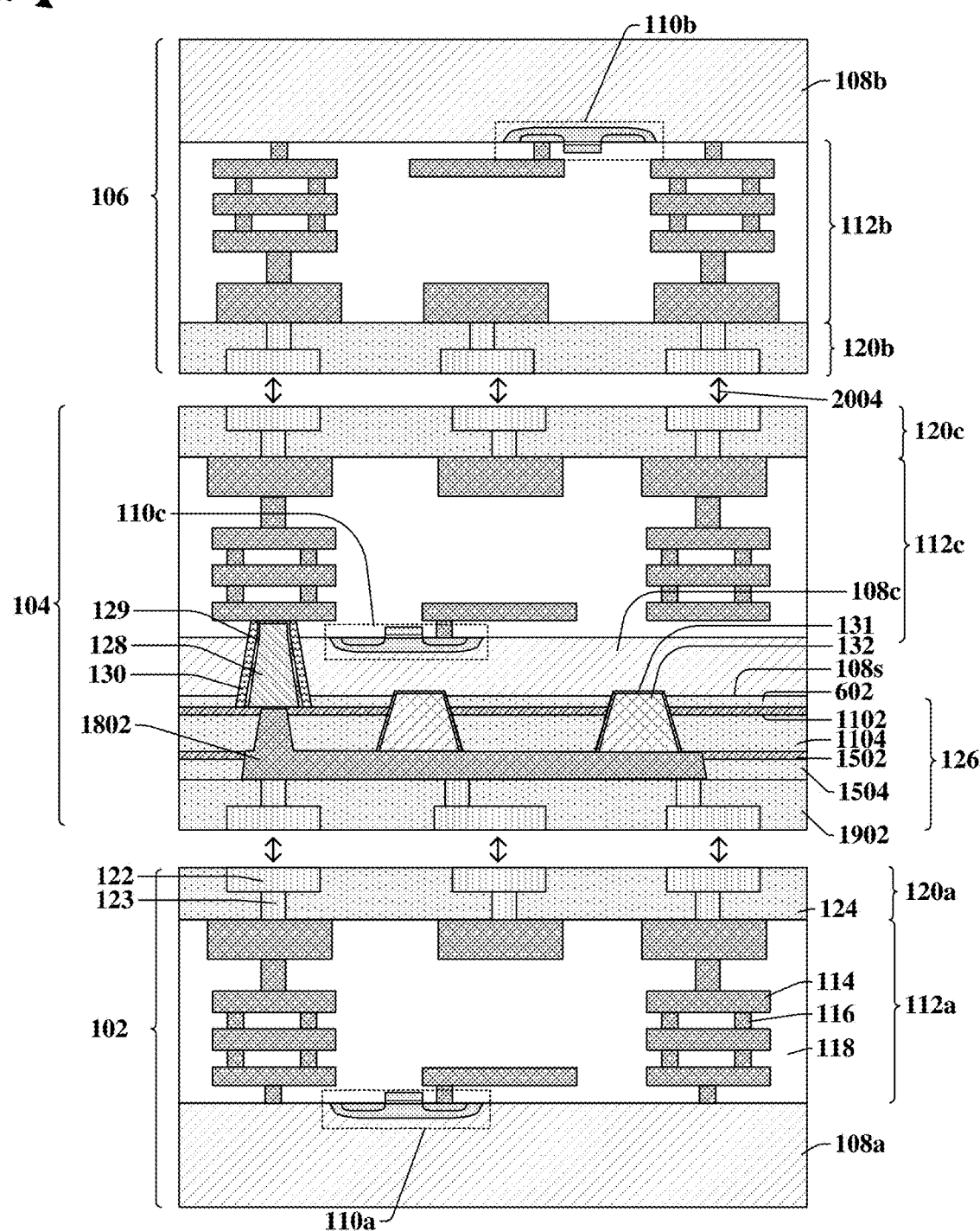

As shown in cross-sectional view 2000 of FIG. 20, in some embodiments, a bonding process 2004 may be conducted to form a 3D IC stack, wherein the additional bonding structure 126 of the third IC die 104 is bonded to a first bonding structure 120a of a first IC die 102, and a third bonding structure 120c (120 of FIG. 19) of the third IC die 104 is bonded to a second bonding structure 120b of a second IC die 106. The bonding process 2004 to bond the respective bonding structures to one another may be a fusion bonding process, a eutectic bonding process, a metallic bonding process, and/or a combination thereof. Thus, in some embodiments, the bonding process 2004 is a hybrid bonding process. In some embodiments, a first and second substrate 108a, 108b of the first and second IC dies 102, 106 may each have a thickness in a range of between approximately 750 micrometers and approximately 800 micrometers. Thus, in some embodiments, a third substrate 108c (108 of FIG. 19) of the third IC die 104 may be thinner than each of the first and second substrates 108a, 108b. The first substrate 108a and the second substrate 108b may respectively define the lowermost and uppermost surfaces of the 3D IC stack. Thus, during operation of the 3D IC stack, any generated heat from the semiconductor devices (e.g., 110a, 110b, 110c) may dissipate away from the semiconductor devices (e.g., 110a, 110b, 110c) and exit the 3D IC stack through the first and second substrates 108a, 108b. Further, because of the backside contacts 132 in the third IC die 104, heat generated in the third substrate 108c may efficiently dissipate through the backside contacts 132 and towards the first and second substrates 108a, 108b through the bonding structures (e.g., 120a, 120b, 120c), the additional bonding structure 126, the TSV 128, and the interconnect structures (e.g., 112a, 112b, 112c) to mitigate thermal damage to the semiconductor devices (e.g., 110a, 110b, 110c).

Figure 21:
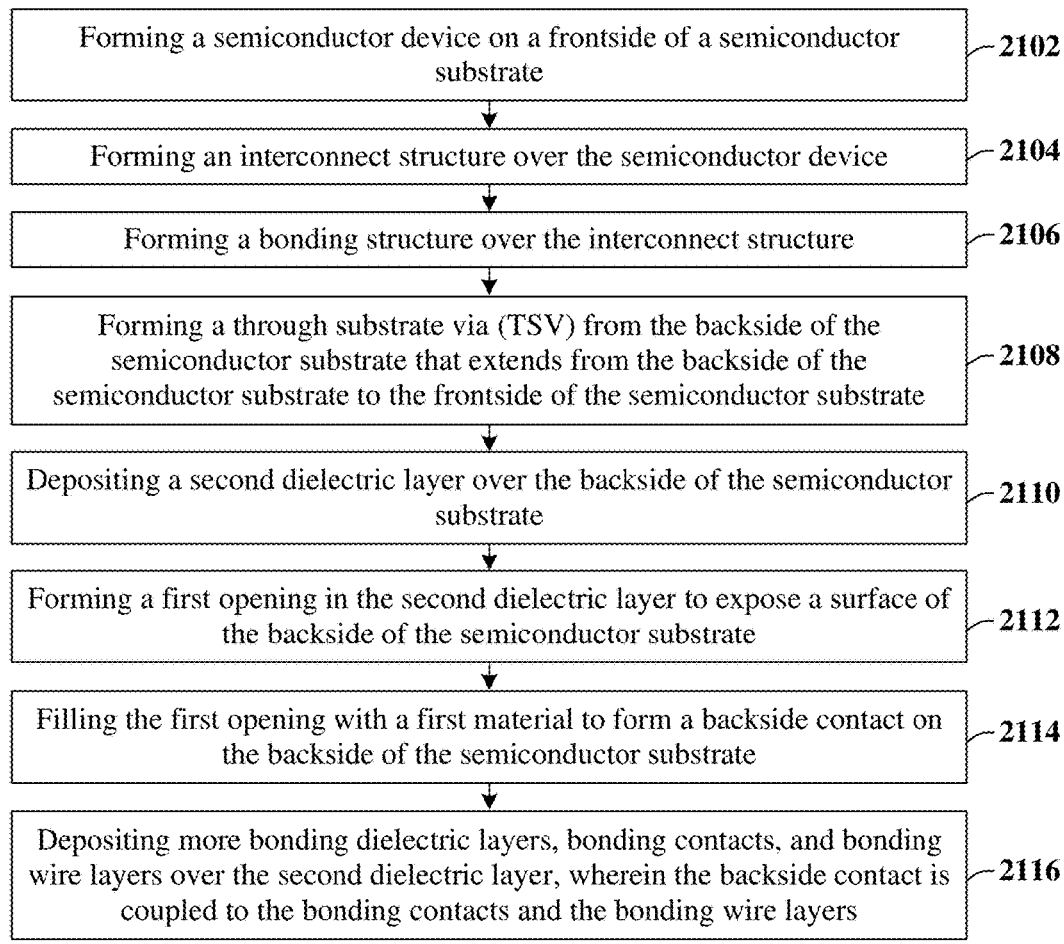
FIG. 21 illustrates a flow diagram of some embodiments of a method corresponding to FIGS. 5-20.

FIG. 21 illustrates a flow diagram of some embodiments of a method 2100 of forming an integrated circuit (IC) die having a backside contact coupled to a through substrate via.

While method 2100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2102, a semiconductor device is formed on a frontside of a semiconductor substrate.

At act 2104, an interconnect structure is formed over the semiconductor device.

At act 2106, a bonding structure is formed over the interconnect structure. FIG. 5 illustrates a cross-sectional view 500 of some embodiments corresponding to the acts 2102, 2104, and 2106.

At act 2108, a through substrate via (TSV) from the backside of the semiconductor substrate is formed that extends from the backside of the semiconductor substrate to a frontside of the semiconductor substrate. FIGS. 7-10 illustrate cross-sectional views 700-1000 of some embodiments corresponding to the act 2108.

At act 2110, a second dielectric layer is deposited over the backside of the semiconductor substrate. FIG. 11 illustrates cross-sectional view 1100 of some embodiments corresponding to the act 2110.

At act 2112, a first opening is formed in the second dielectric layer to expose a surface of the backside of the semiconductor substrate. FIG. 12 illustrates cross-sectional view 1200 of some embodiments corresponding to the act 2112.

At act 2114, the first opening is filled with a first material to form a backside contact on the backside of the semiconductor substrate. FIGS. 13 and 14 illustrate cross-sectional views 1300 and 1400 of some embodiments corresponding to the act 2114.

At act 2116, more bonding dielectric layers, bonding contacts, and bonding wire layers are deposited over the second dielectric layer, wherein the backside contact is coupled to the bonding contacts and the bonding wire layers. FIG. 19 illustrates cross-sectional view 1900 of some embodiments corresponding to the act 2116.

Therefore, the present disclosure relates to a 3D IC stack that uses a backside contact on a backside of a semiconductor substrate of a third IC die vertically between first and second IC dies to provide an efficient heat dissipation path for heat generated in the semiconductor substrate of the third IC die during operation in order to improve device lifetime and reliability.

Accordingly, in some embodiments, the present disclosure relates to a three-dimensional (3D) integrated circuit (IC) stack comprising: a first IC die comprising a first semiconductor substrate, a first interconnect structure arranged on a frontside of the first semiconductor substrate, and a first bonding structure arranged over the first interconnect structure; a second IC die comprising a second semiconductor substrate, a second interconnect structure arranged on a frontside of the second semiconductor substrate, and a second bonding structure arranged on the second interconnect structure, wherein the second bonding structure faces the first bonding structure; a third IC die comprising a third semiconductor substrate, a third interconnect structure arranged on a frontside of the third semiconductor substrate, and a third bonding structure arranged on a backside of the third semiconductor substrate, wherein the third IC die is arranged vertically between the first and second IC dies; and a heat dissipation path extending from the third semiconductor substrate to at least one of the first semiconductor substrate or the second semiconductor substrate, the heat dissipation path comprising a first backside contact extending from the third bonding structure to the backside of the third semiconductor substrate, wherein the first backside contact is thermally coupled to at least one of the first interconnect structure or the second interconnect structure.

In other embodiments, the present disclosure relates to an integrated circuit (IC) die comprising: a semiconductor substrate; a semiconductor device integrated on a frontside of the semiconductor substrate; an interconnect structure arranged on the frontside of the semiconductor substrate, coupled to the semiconductor device, and comprising interconnect vias and interconnect wires embedded within dielectric layers; a first bonding structure arranged over the interconnect structure; a second bonding structure arranged on a backside of the semiconductor substrate and comprising bonding wires and bonding vias within a bonding dielectric structure; and a backside contact arranged within the second bonding structure, wherein a top surface of the backside contact is thermally coupled to the backside of the semiconductor substrate, wherein the top surface of the backside contact is spaced from the frontside of the semiconductor substrate by the semiconductor substrate, and wherein the backside contact is thermally and electrically coupled to the second bonding structure.

In yet other embodiments, the present disclosure relates to a method of forming an integrated circuit, the method comprising: forming a semiconductor device on a frontside of a semiconductor substrate; forming an interconnect structure over the semiconductor device; forming a first bonding structure over the interconnect structure; depositing a second dielectric layer over a backside of the semiconductor substrate; patterning the second dielectric layer to form a first opening in the second dielectric layer, wherein the first opening exposes a surface of the backside of the semiconductor substrate, and wherein the surface of the backside of the semiconductor substrate is above the semiconductor device when the backside of the semiconductor substrate is above the frontside of the semiconductor substrate; depositing a glue layer having a first thickness over the first opening; filling the first opening with a first material to form a backside contact that is separated from the semiconductor substrate by the glue layer; and depositing more dielectric layers, bonding contacts, and bonding wire layers over the second dielectric layer to form a second bonding structure on the backside of the semiconductor substrate, wherein the backside contact is coupled to the bonding contacts and the bonding wire layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, the method comprising:
   forming a semiconductor device on a frontside of a semiconductor substrate;
   forming an interconnect structure over the semiconductor device;
   forming a first bonding structure over the interconnect structure;
   depositing a dielectric layer over a backside of the semiconductor substrate;
   patterning the dielectric layer to form a first opening in the dielectric layer, wherein the first opening exposes a surface of the backside of the semiconductor substrate, and wherein the surface of the backside of the semiconductor substrate is above the semiconductor device when the backside of the semiconductor substrate is above the frontside of the semiconductor substrate;
   depositing a glue layer having a first thickness over the first opening;
   filling the first opening with a first material to form a backside contact that is separated from the semiconductor substrate by the glue layer; and
   depositing more dielectric layers, bonding contacts, and bonding wire layers over the dielectric layer to form a second bonding structure on the backside of the semiconductor substrate, wherein the backside contact is coupled to the bonding contacts and the bonding wire layers.

2. The method of claim 1, wherein before the first opening is formed, the method further comprises:
   forming a second opening that extends from the backside of the semiconductor substrate to the frontside of the semiconductor substrate, wherein the second opening exposes a metal line within the interconnect structure;

forming a lining in the second opening using a second material; and filling the second opening with a third material different from the first and second materials to form a through substrate via (TSV), wherein the lining separates the TSV from the semiconductor substrate.

3. The method of claim 2, wherein the lining is thicker than the glue layer.

4. The method of claim 2, wherein the TSV is coupled to the backside contact.

5. The method of claim 2, wherein the lining includes a chemical barrier layer and an electrical insulator layer.

6. A method of forming an integrated circuit, the method comprising:

forming a semiconductor device on a frontside of a semiconductor substrate;

forming an interconnect structure over the semiconductor device;

forming a dielectric layer over a backside of the semiconductor substrate;

patterning the dielectric layer to form a first opening in the dielectric layer, wherein the first opening exposes a surface of the backside of the semiconductor substrate;

forming a glue layer having a first thickness over the first opening;

filling the first opening with a first material to form a backside contact that is separated from the semiconductor substrate by the glue layer;

forming a second opening that defines a conical gap through the semiconductor substrate, wherein the second opening extends into the interconnect structure;

forming a lining in the second opening, wherein the lining comprises a chemical barrier layer and an electrical insulator layer and the lining is thicker than the glue layer;

filling the second opening with a second material to form a through substrate via (TSV), wherein the lining separates the TSV from the semiconductor substrate; and forming a bonding structure on the backside of the dielectric layer, wherein the backside contact is coupled to the bonding structure and the TSV.

7. The method of claim 6, wherein the bonding structure comprises a dielectric layer, a bonding contact, and a bonding wire layer deposited over the dielectric layer.

8. The method of claim 6, further comprising:

forming a second bonding structure over the interconnect structure opposite the semiconductor substrate.

9. The method of claim 8, wherein the backside contact is electrically coupled to the second bonding structure through the interconnect structure.

10. The method of claim 8, further comprising:

bonding the second bonding structure to a third bonding structure of an integrated chip die, the integrated chip die comprising the third bonding structure and a fourth bonding structure, wherein the third bonding structure and the fourth bonding structure are on opposite sides of the integrated chip die.

11. The method of claim 10, wherein the backside contact is thermally coupled to the fourth bonding structure.

12. The method of claim 6, wherein a top surface of the TSV is extends further into the interconnect structure than the semiconductor device.

13. The method of claim 6, wherein a top surface of the backside contact is separated from the semiconductor device by the semiconductor substrate.

14. The method of claim 6, wherein a sidewall of the glue layer contacting both the dielectric layer and the semiconductor substrate extends through the dielectric layer at a first angle measured from an interface between the semiconductor substrate and the dielectric layer, and a sidewall of the electrical insulator layer that contacts both the interconnect structure and the dielectric layer extends through the dielectric layer at a second angle measured from an interface between the semiconductor substrate and the dielectric layer, and wherein the first angle is smaller than the second angle.

15. A method of forming an integrated circuit, the method comprising:

forming a dielectric layer over a backside of a semiconductor substrate;

patterning the dielectric layer to form a first opening in the dielectric layer, wherein the first opening exposes a surface of the backside of the semiconductor substrate;

forming a glue layer over the first opening;

filling the first opening with a first material to form a backside contact that is separated from the semiconductor substrate by the glue layer;

forming a second opening in the dielectric layer, wherein the second opening extends through the semiconductor substrate;

forming a lining in the second opening using a second material, wherein the lining comprises a chemical barrier layer and an electrical insulator; and filling the second opening with a third material to form a through substrate via (TSV), wherein the lining separates the TSV from the semiconductor substrate and where a top surface of the backside contact extends past a highest lower surface of the TSV.

16. The method of claim 15, further comprising:

forming an interconnect structure over the semiconductor substrate, wherein the interconnect structure is electrically coupled to a semiconductor device on a frontside of the semiconductor substrate.

17. The method of claim 15, wherein the third material is different than the first and the second material.

18. The method of claim 15, further comprising:

forming a bonding structure over the dielectric layer, comprising bonding wires within a bonding dielectric structure, wherein the bonding wires electrically and thermally couple the TSV to the backside contact.

19. The method of claim 15, wherein a highest lower surface of the TSV extends past a top surface of the backside contact.

20. The method of claim 18, wherein the bonding structure is bonded to an integrated chip die, and the integrated chip die is thermally coupled to the backside contact.

* * * * *